United States Patent
Horiguchi et al.

(10) Patent No.: US 6,851,017 B2
(45) Date of Patent: Feb. 1, 2005

(54) SEMICONDUCTOR MEMORY

(75) Inventors: Masashi Horiguchi, Koganei (JP); Shigeki Ueda, Hachioji (JP); Hideharu Yahata, Inagi (JP)

(73) Assignee: Renesas Technology Corp., Tokyo (JP)

( * ) Notice: Subject to any disclaimer, the term of this patent is extended or adjusted under 35 U.S.C. 154(b) by 214 days.

(21) Appl. No.: 10/174,962

(22) Filed: Jun. 20, 2002

(65) Prior Publication Data

US 2003/0028712 A1 Feb. 6, 2003

(30) Foreign Application Priority Data

Jul. 31, 2001 (JP) ........................................ 2001-230751

(51) Int. Cl.[7] .............................................. G06F 12/00
(52) U.S. Cl. ...................... 711/106; 711/5; 365/185.25; 365/222
(58) Field of Search .............................. 711/104–106, 5; 365/200, 222, 230.03–233, 185.25

(56) References Cited

U.S. PATENT DOCUMENTS 6,115,302 A * 9/2000 Proebsting .................. 365/200
6,134,176 A * 10/2000 Proebsting ............. 365/230.06
6,212,118 B1 * 4/2001 Fujita ......................... 365/222

FOREIGN PATENT DOCUMENTS

JP          61-71491          9/1984

* cited by examiner

*Primary Examiner*—Nasser Moazzami
(74) *Attorney, Agent, or Firm*—Reed Smith LLP; Stanley P. Fisher, Esq.; Juan Carlos A. Marquez, Esq.

(57) ABSTRACT

The present invention provides a semiconductor memory capable of shortening a refresh cycle time and reducing power consumption at refresh. The semiconductor memory includes an address input circuit for generating each of internal address signals, a redundant judgement circuit for receiving the internal address signal therein and determining whether the corresponding address corresponds to an address for a defective word line of a plurality of normal word lines, and an address counter for generating refresh address signals for sequentially refreshing the plurality of normal word lines and redundant word lines. The redundant judgment circuit is deactivated upon refresh.

21 Claims, 22 Drawing Sheets

FIG. 4

| PERIOD | RE_R | BX3_R | BX2_R | BX1_R | BX0_R | REFRESHED WORD LINE |
|---|---|---|---|---|---|---|
| ~t0 | 0 | 0 | 0 | 0 | 0 | W0 |
| t1~t2 | 0 | 0 | 0 | 0 | 1 | W1 |
| t3~t4 | 0 | 0 | 0 | 1 | 0 | W2 |
| t5~t6 | 0 | 0 | 0 | 1 | 1 | W3 |
| t7~t8 | 0 | 0 | 1 | 0 | 0 | W4 |
| t9~t10 | 0 | 0 | 1 | 0 | 1 | W5 |
| t11~t12 | 0 | 0 | 1 | 1 | 0 | W6 |
| t13~t14 | 0 | 0 | 1 | 1 | 1 | W7 |
| t15~t16 | 0 | 1 | 0 | 0 | 0 | W8 |
| t17~t18 | 0 | 1 | 0 | 0 | 1 | W9 |
| t19~t20 | 0 | 1 | 0 | 1 | 0 | W10 |
| t21~t22 | 0 | 1 | 0 | 1 | 1 | W11 |
| t23~t24 | 0 | 1 | 1 | 0 | 0 | W12 |
| t25~t26 | 0 | 1 | 1 | 0 | 1 | W13 |
| t27~t28 | 0 | 1 | 1 | 1 | 0 | W14 |
| t29~t30 | 0 | 1 | 1 | 1 | 1 | W15 |
| t31~t32 | 1 | 0 | 0 | 0 | 0 | RW0 |
| t33~t34 | 1 | 0 | 0 | 0 | 1 | RW1 |

FIG. 7

| PERIOD | RE_R | BX3_R | BX2_R | BX1_R | BX0_R | REFRESHED WORD LINE |
|---|---|---|---|---|---|---|
| ~t0 | 0 | 0 | 0 | 0 | 0 | W0 |
| t1~t2 | 0 | 0 | 0 | 0 | 1 | W1 |
| t3~t4 | 0 | 0 | 0 | 1 | 1 | W3 |
| t5~t6 | 0 | 0 | 0 | 1 | 0 | W2 |
| t7~t8 | 0 | 0 | 1 | 1 | 0 | W6 |
| t9~t10 | 0 | 0 | 1 | 1 | 1 | W7 |
| t11~t12 | 0 | 0 | 1 | 0 | 1 | W5 |
| t13~t14 | 0 | 0 | 1 | 0 | 0 | W4 |
| t15~t16 | 0 | 1 | 1 | 0 | 0 | W12 |
| t17~t18 | 0 | 1 | 1 | 0 | 1 | W13 |
| t19~t20 | 0 | 1 | 1 | 1 | 1 | W15 |
| t21~t22 | 0 | 1 | 1 | 1 | 0 | W14 |
| t23~t24 | 0 | 1 | 0 | 1 | 0 | W10 |
| t25~t26 | 0 | 1 | 0 | 1 | 1 | W11 |
| t27~t28 | 0 | 1 | 0 | 0 | 1 | W9 |
| t29~t30 | 0 | 1 | 0 | 0 | 0 | W8 |
| t31~t32 | 1 | 1 | 0 | 0 | 0 | RW1 |
| t33~t34 | 1 | 0 | 0 | 0 | 0 | RW0 |

FIG. 19

| PERIOD | CX30_R | CX31_R | ... | CX37_R | CX60_R | CX61_R | CX62_R | CX63_R | RE_R | CX00_R | CX01_R | ... | CX03_R | REFRESHED WORD LINE |
|---|---|---|---|---|---|---|---|---|---|---|---|---|---|---|
| ~t0 | 1 | 0 | ... | 0 | 1 | 0 | 0 | 0 | 0 | 1 | 0 | ... | 0 | W0 |
| t1~t2 | 0 | 1 | ... | 0 | 1 | 0 | 0 | 0 | 0 | 1 | 0 | ... | 0 | W8 |
| ⋮ | ⋮ | ⋮ | | ⋮ | ⋮ | ⋮ | ⋮ | ⋮ | ⋮ | ⋮ | ⋮ | | ⋮ | ⋮ |
| t13~t14 | 0 | 0 | ... | 1 | 1 | 0 | 0 | 0 | 0 | 1 | 0 | ... | 0 | W56 |
| t15~t16 | 1 | 0 | ... | 0 | 0 | 1 | 0 | 0 | 0 | 1 | 0 | ... | 0 | W64 |
| t17~t18 | 0 | 1 | ... | 0 | 0 | 1 | 0 | 0 | 0 | 1 | 0 | ... | 0 | W72 |
| ⋮ | ⋮ | ⋮ | | ⋮ | ⋮ | ⋮ | ⋮ | ⋮ | ⋮ | ⋮ | ⋮ | | ⋮ | ⋮ |
| t29~t30 | 0 | 0 | ... | 1 | 0 | 1 | 0 | 0 | 0 | 1 | 0 | ... | 0 | W120 |
| t31~t32 | 1 | 0 | ... | 0 | 0 | 0 | 1 | 0 | 0 | 1 | 0 | ... | 0 | W128 |
| t33~t34 | 0 | 1 | ... | 0 | 0 | 0 | 1 | 0 | 0 | 1 | 0 | ... | 0 | W136 |
| ⋮ | ⋮ | ⋮ | | ⋮ | ⋮ | ⋮ | ⋮ | ⋮ | ⋮ | ⋮ | ⋮ | | ⋮ | ⋮ |
| t45~t46 | 0 | 0 | ... | 1 | 0 | 0 | 1 | 0 | 0 | 1 | 0 | ... | 0 | W184 |
| t47~t48 | 1 | 0 | ... | 0 | 0 | 0 | 0 | 1 | 0 | 1 | 0 | ... | 0 | W192 |
| t49~t50 | 0 | 1 | ... | 0 | 0 | 0 | 0 | 1 | 0 | 1 | 0 | ... | 0 | W200 |
| ⋮ | ⋮ | ⋮ | | ⋮ | ⋮ | ⋮ | ⋮ | ⋮ | ⋮ | ⋮ | ⋮ | | ⋮ | ⋮ |
| t61~t62 | 0 | 0 | ... | 1 | 0 | 0 | 0 | 1 | 0 | 1 | 0 | ... | 0 | W248 |
| t63~t64 | 0 | 0 | ... | 0 | 0 | 0 | 0 | 0 | 1 | 1 | 0 | ... | 0 | RW0 |
| t65~t66 | 1 | 0 | ... | 0 | 1 | 0 | 0 | 0 | 0 | 0 | 1 | ... | 0 | W1 |
| t67~t68 | 0 | 1 | ... | 0 | 1 | 0 | 0 | 0 | 0 | 0 | 1 | ... | 0 | W9 |
| ⋮ | ⋮ | ⋮ | | ⋮ | ⋮ | ⋮ | ⋮ | ⋮ | ⋮ | ⋮ | ⋮ | | ⋮ | ⋮ |
| t79~t80 | 0 | 1 | ... | 0 | 1 | 0 | 0 | 0 | 0 | 0 | 1 | ... | 0 | W57 |
| ⋮ | ⋮ | ⋮ | | ⋮ | ⋮ | ⋮ | ⋮ | ⋮ | ⋮ | ⋮ | ⋮ | | ⋮ | ⋮ |

SEMICONDUCTOR MEMORY

BACKGROUND OF THE INVENTION

The present invention relates to a semiconductor memory using dynamic memory cells, and particularly to a technology effective for application to the speeding up of a semiconductor memory having a redundant circuit and a reduction in power consumption.

As a storage elemental device used in various electronic apparatuses, there is known a dynamic random access memory (hereinafter called a "DRAM"), which needs regular refresh to hold memory information therein although it has an advantage in that it is high in the degree of integration and low in bit cost. Thus, the dynamic random access memory is normally used together with a memory controller having a refresh command issuing function. This is unsuitable for a small-sized system like a cellular phone. A static random access memory (hereinafter called simply an "SRAM") is principally used as a storage elemental device for the small-sized system at present. With high functionality of portable equipment, however, there has been an increasingly demand for a larger-capacity storage elemental device. Therefore, the SRAM has not been brought into line with costs of production.

A method of eliminating the need for refresh of a DRAM from outside has been disclosed in Unexamined Patent Publication No. Sho 61(1986)-71491. This is a method of dividing one cycle into two time zones or slots and performing refresh in the first half and performing a read or write operation in the last half. If done in this way, then the refresh operation can be concealed from outside, and a DRAM low in bit cost can be used in a manner similar to the SRAM (as a pseudo SRAM).

SUMMARY OF THE INVENTION

A problem of the related art resides in that when a memory is under refresh where a read/write request is inputted, reading/writing cannot be started until the refresh operation is completed. It is not possible to precedently estimate when a read/write request is inputted. Assuming that the read/write request is inputted immediately after the start of the refresh operation as the worst case, an access time becomes long by a refresh cycle time. It is desirable that the refresh cycle time is reduced as short as possible to limit an increase in the access time to the minimum.

An object of the present invention is to provide a semiconductor memory capable of shortening a refresh cycle time and reducing power consumption at refresh. The above, other objects and novel features of the present invention will become apparent from the description of the present specification and the accompanying drawings.

A summary of a typical one of the inventions disclosed in the present application will be described in brief as follows: A semiconductor memory includes an address input circuit for generating each of internal address signals, a redundant judgement circuit for receiving the internal address signal therein and determining whether the corresponding address corresponds to an address for a defective word line of a plurality of normal word lines, and an address counter for generating refresh address signals for sequentially refreshing the plurality of normal word lines and redundant word lines. The redundant judgment circuit is deactivated upon refresh.

BRIEF DESCRIPTION OF THE DRAWINGS

FIG. 4 is a signal relational diagram for describing the operation of the refresh address counter AC1 shown in FIG. 2;

FIG. 7 is a signal relational diagram for describing the operation of the refresh address counter AC1 shown in FIG. 5;

FIG. 19 is a signal relational diagram for describing the operation of the refresh address counter shown in FIG. 16;

DETAILED DESCRIPTION OF THE PREFERRED EMBODIMENTS

Figure 1:
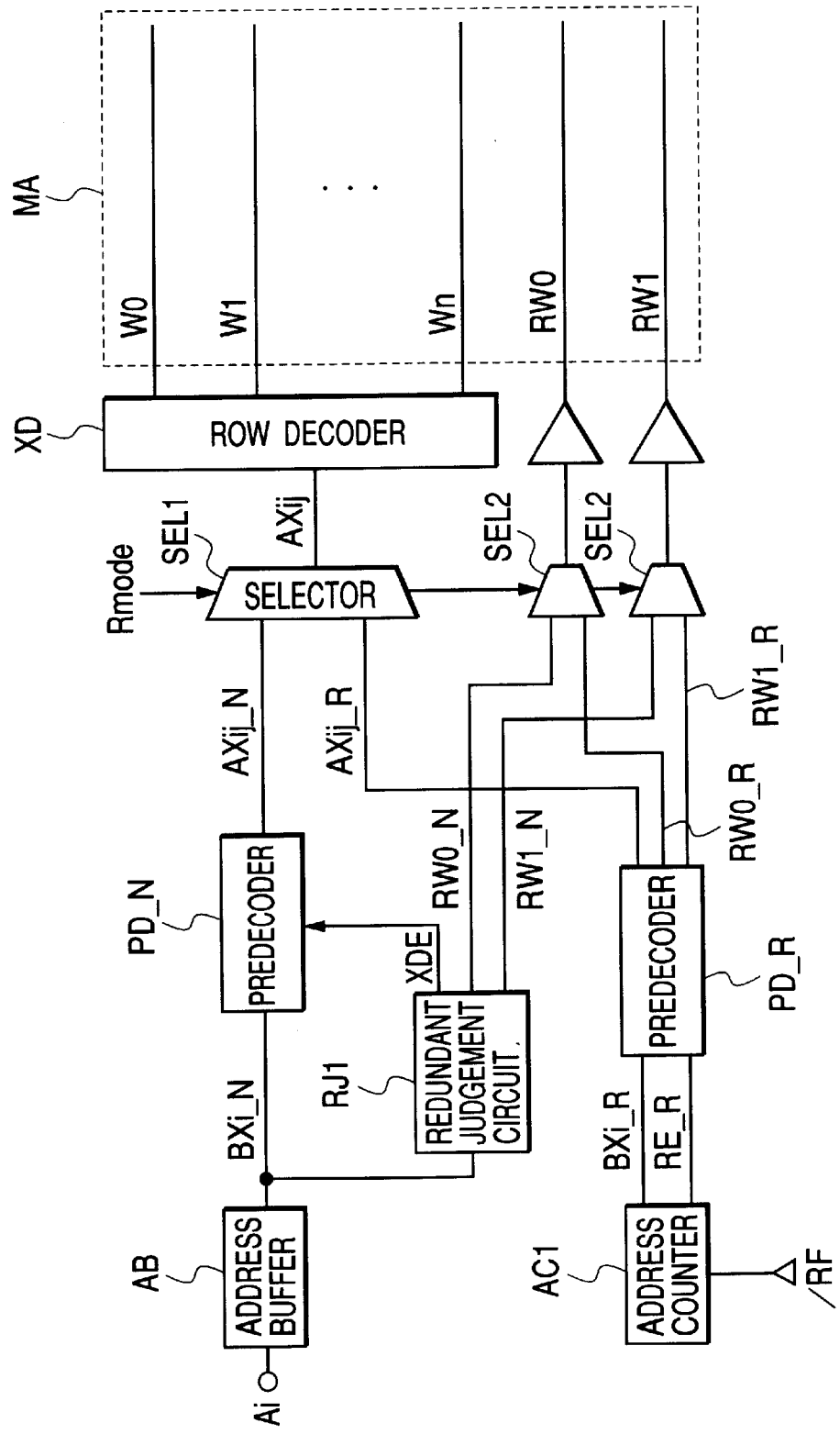
FIG. 1 is a schematic block diagram showing one embodiment of a DRAM according to the present invention.

A schematic block diagram showing one embodiment of a DRAM according to the present invention is shown in FIG. 1. AB indicates an address input circuit, which receives an external address signal Ai (where i=0 to k) therein and generates an internal row address signal BXi_N. RJ1 indicates a redundant judgement circuit, which determines whether the internal row address signal BXi_N corresponds to an address for a defective word line. PD_N indicates a predecoder, which decodes the internal row address signal BXi_N to thereby generate a predecode signal AXij_N. The address input circuit AB, the redundant judgement circuit RJ1 and the predecoder PD_N are used upon a read or write operation. Thus, _N respectively indicate circuits and/or signals for a normal system which copes with a normal operation.

AC1 indicates a refresh address counter, which generates a refresh address signal BXi_R for each word line to be refreshed. PD_R indicates a predecoder, which decodes the refresh address signal BXi_R to thereby generate a predecode signal AXij_R. The refresh address counter AC1 and the predecoder PD_R are used upon a refresh operation. Thus, _R respectively indicate circuits and/or signals for a refresh system which copes with the refresh operation.

SEL1 and SEL2 respectively indicate selectors, each of which selects and outputs any one of two inputs according to a refresh mode signal Rmode. Namely, the signal AXij_N and redundant judgement signals RW0_N and RW1_N are selected in association with one level of the signal Rmode upon the read/write operation (normal mode), and the signal AXij_R and RW0_R and RW1_R are selected upon refresh (refresh mode), whereby their corresponding signals AXij, RW0 and RW1 are outputted.

XD indicates a row decoder, and MA indicates a memory array in which normal word lines W0 through Wn and redundant word lines RW0 and RW1 are disposed. While their description is omitted in the drawing, bit lines are disposed so as to intersect their corresponding word lines, and memory cells are respectively placed at points where the word lines and the bit lines intersect respectively. Incidentally, only circuits that belong to row (word line) relations related to the present invention, are shown in the drawing. Circuits that belong to column (bit line) relations, data input/output circuits, etc. are omitted.

A description will next be made of at-read/write operations. The address input circuit AB generates an internal row address signal BXi_N from the external address signal Ai (where i=0 to k). The redundant judgement circuit RJ1 makes a decision as to whether the internal address signal BXi_N corresponds to an address for a defective word line. When it is judged not to be the defective word line, a signal XDE results in "1" (e.g., high level), and redundant word line activation signals RW0_N and RW1_N result in "0" (e.g., low level).

The predecoder PD_N is enabled by the signal XDE and thereby decodes BXi_N to generate a predecode signal AXij_N. The selector SEL1 selects it and transfers the same to the row decoder XD as a signal AXij. The row decoder XD further decodes the signal and converts the same into a voltage level if necessary, thereby activating one of the normal word lines. On the other hand, since both the signals RW0_N and RW1_N are of "0" although they are selected by the selector SEL2, redundant word lines RW0 and RW1 are not activated.

When it is judged that the internal address signal BXi_N corresponds to the address for the defective word line, the signal XED results in "0" and any one of the signals RW0_N and RW1_N results in "1". Thus, since the pre-decoder PD_N is disabled, the normal word lines are deactivated. On the other hand, since either the signal RW0_N or RW1_N is "1", ether the redundant word line RW0 or RW1 is activated as an alternative to the normal word line.

A description will next be made of an at-refresh operation. An address signal BXi_R and a redundant enable signal RE_R generated by the refresh address counter A1 are inputted to the predecoder PR_R. In response to them, the predecoder PD_R generates a predecode signal AXij_R and redundant word line activation signals RW0_R and RW1_R. When the redundant enable signal RE_R is "O", any of the predecode signal AXij_R results in "1" and the signals RW0_R and RW1_R result in "0".

The address signal AXij_R is selected by the selector SEL1 and transmitted to the row decoder XD as a signal AXij. The row decoder XD further decodes the signal and performs voltage level conversion thereon if necessary to thereby activate one of the normal word lines. On the other hand, since both RW0_R and RW1_R are "0" although they are selected by the selector SEL2, the redundant word lines RW0 and RW1 are deactivated. Since the signal AXij_R is not generated when the redundant enable signal RE_R is "0", the normal word lines are not activated. On the other hand, since either the RW0_R or RW1_R is "1", the redundant word line RW0 or RW1 is activated.

The present embodiment is characterized in that the circuit for the read/write and the circuit for the refresh are separately provided and the redundant judgement circuit is provided only for the read/write. Namely, the circuit for the refresh does not include the redundant judgement circuit. Accordingly, while a redundant judgement is done upon the read/write, it is not performed upon refresh. Thus, the refresh operation can be speeded up by an operation time of the redundant judgement circuit, and power consumption equivalent to that by the redundant judgement circuit can be reduced. It is desirable that the read/write circuit is not operated at all upon refresh to reduce power consumption. To this end, the output signal BXi_N of the address buffer may be fixed, for example.

A second feature of the present embodiment is that the refresh address counter AC1 outputs the redundant enable signal RE_R. Thus, even if the redundant judgement is not done, each memory cell connected to its corresponding redundant word line can also be refreshed in a manner similar to memory cells connected to the normal word lines. Main circuits that constitute the DRAM shown in FIG. 1, will next be described below in detail with reference to the following drawings.

Figure 2:
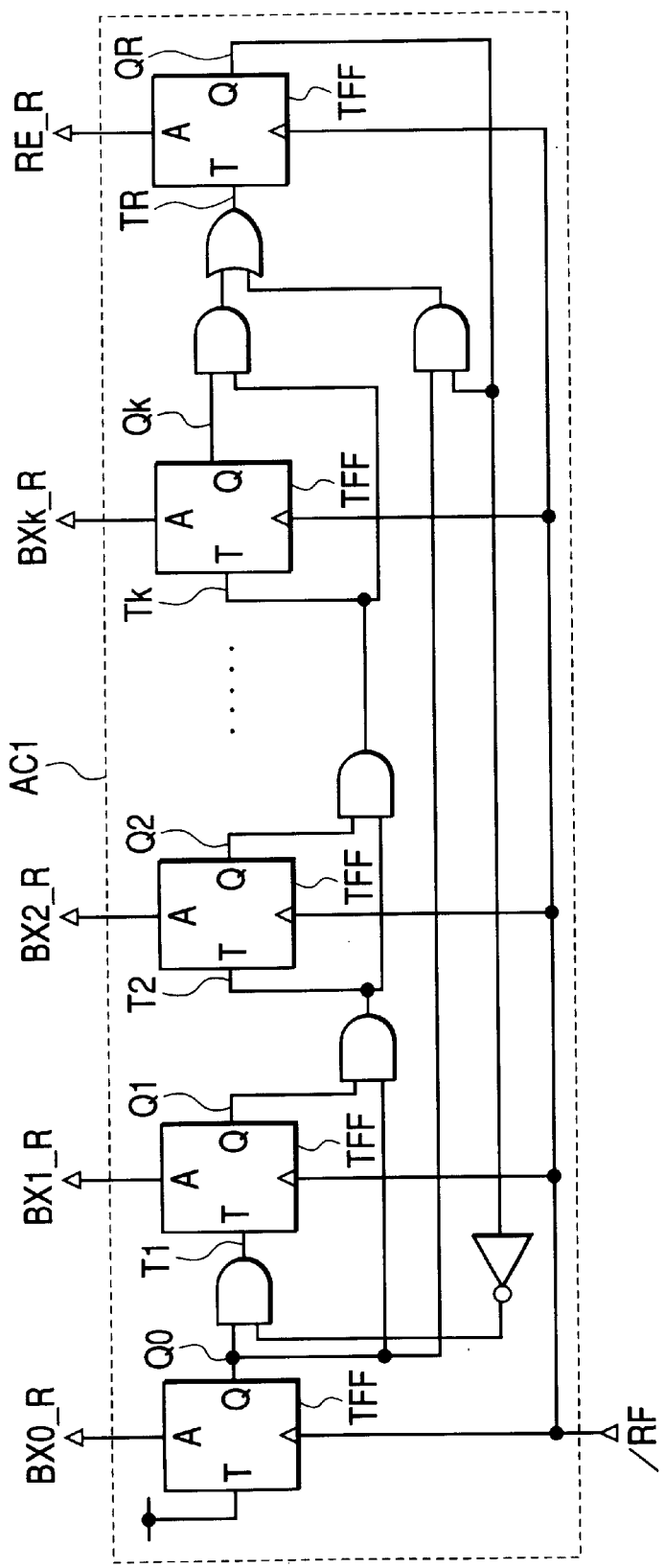
FIG. 2 is a circuit diagram illustrating one embodiment of a refresh address counter AC1 shown in FIG. 1.

A circuit diagram of one embodiment of the refresh address counter AC1 shown in FIG. 1 is shown in FIG. 2. The refresh address counter AC1 comprises (k+2) T-type flip-flops TFF and number of logic gates. A signal /RF is a refresh signal (where "/" affixed in front of a signal name indicates a signal of negative logic). The signal /RF results in 0 upon the start of a refresh operation and results in "1" upon the completion of the refresh operation. This is used as a clock for each flip-flop. Outputs Q of the respective flip-flops respectively change on the falling edge of /RF when T inputs are given as "1", whereas when the T inputs are given as "0", the outputs Q thereof remain unchanged. Refresh address outputs BX0_R through BXk_R are respectively earlier by a half cycle than the outputs of the flip-flops, i.e., they change on the rising edge of the signal /RF. The operation of this circuit will next be explained.

Figure 3:
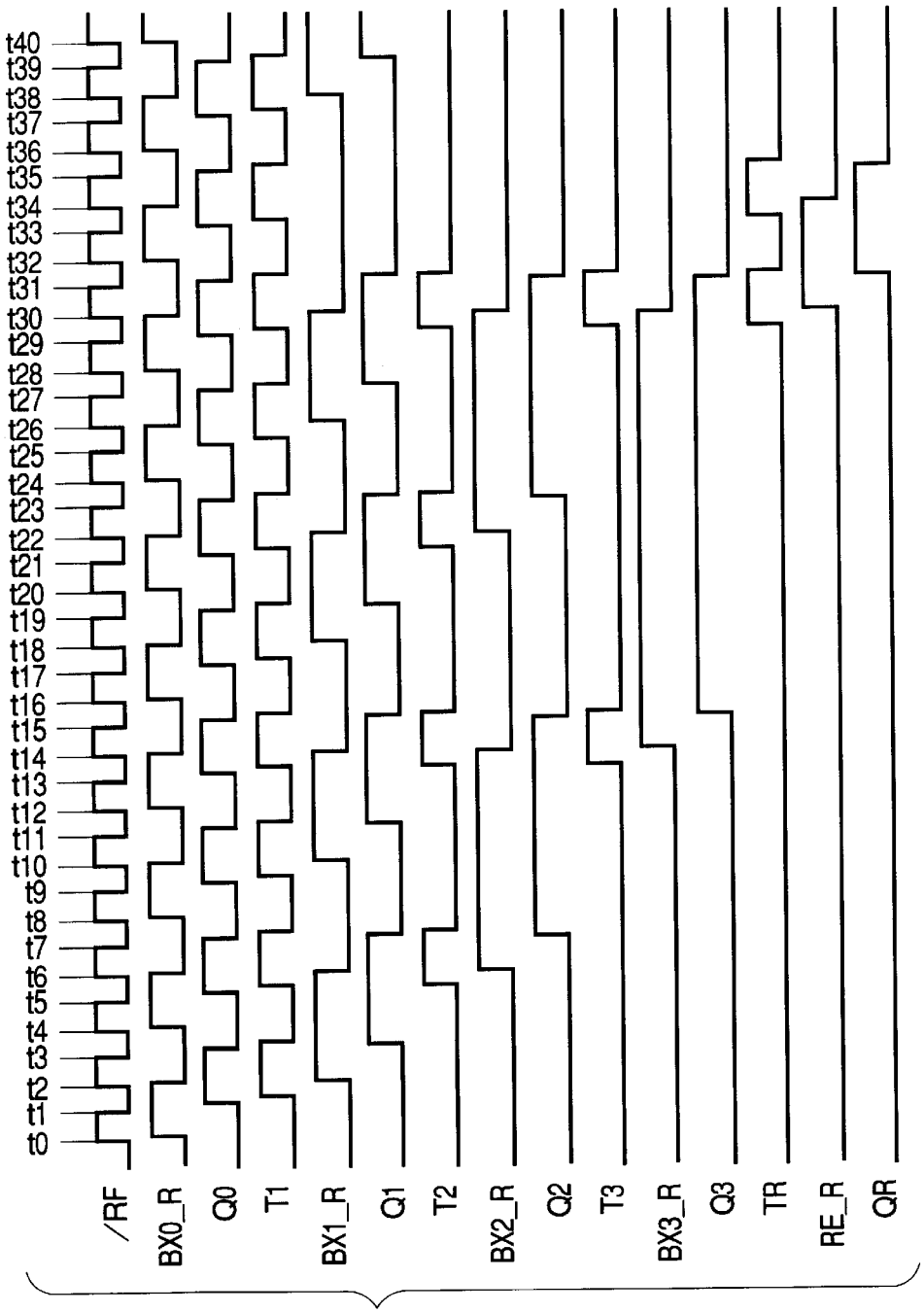
FIG. 3 is an operation waveform diagram for describing the operation of the refresh address counter AC1 shown in FIG. 2.

An operation waveform diagram for describing the operation of the refresh address counter AC1 shown in FIG. 2 is shown in FIG. 3. For simplicity, FIG. 3 shows a case in which k=3. In its initial state, outputs Q0 through Q3 of the respective flip-flops are all "0" and refresh address outputs BX0_R through BX3_R are all "0". In this state, the refresh of a word line W0 corresponding to an address "0000" is executed.

When the signal /RF rises at a time t0, the refresh address signal BX0_R is first brought to "1" (high level). When the signal /RF falls at a time t1, the count output Q0 of the refresh address counter AC1 reaches "1". Accordingly, the refresh of a word line W1 corresponding to an address "0001" is executed from the times t1 to t2.

When the signal /RF rises at the time t2, the refresh address signal BX0_R results in "0" and the BX1_R results in "1". When the signal /RF falls at a time t3, the count output Q0 of the refresh address counter AC1 is brought to "0" and the same Q1 thereof is brought to "1". Thus, the refresh of a word line W2 corresponding to an address "0010" is executed from the time t3 to a time t4. Addresses are advanced or put forward similarly subsequently, and the refresh of a word line W15 corresponding to an address "1111" is executed from times t29 to t30.

When the signal /RF rises at the time t30, all the refresh address signals BX0_R through BX3_R are brought to "0" and the redundant enable signal RE_R is brought to "1". Thus, the refresh of the redundant word line RW0 is executed from times t31 to t32. When the signal /RF rises at the time t32, the refresh address signal BX0_R is brought to "1". The redundant enable signal RE_R remains at "1". Accordingly, the refresh of the redundant word line RW1 is executed from times t33 to t34. When the signal /RF rises at the time t34, the refresh address signals BX0_R and BX1_R are brought to "0", and the refresh of the word line W0 corresponding to the address "0000" is executed again from a time t35. The above is summarized as such a relational diagram as shown in FIG. 4.

Namely, the redundant enable signal RE_R, refresh address signals BX3_R through BX0_R and refreshed word lines W0 through RW1 take such a relationship as illustrated in FIG. 4 during 18 periods defined by the times t0 through t34.

The refresh address counter AC1 employed in the present embodiment is characterized in that even the addresses corresponding to the redundant word lines RW0 and RW1 are outputted as well as the addresses corresponding to the normal word lines W0 through W15. Namely, the redundant enable signal RE_R="1" indicates that the redundant word line should be selected. The refresh address signal BX0_R at this time indicates which redundant word line should be selected.

The refresh address counter employed in the conventional DRAM has simply outputted only the addresses corresponding to the normal word lines. Since the number of the normal word lines is normally equal to the power of 2, the refresh address counter was also commonly operated with a cycle corresponding to the power of 2 as a period. On the other hand, the present refresh address counter is operated with the sum of the number of the normal word lines and the number of the redundant word lines as a cycle or period. In the examples shown in FIGS. 3 and 4, for instance, the refresh address counter is activated with 16+2=18 cycles as a period. Thus, even if the redundant judgement is not performed upon refresh, the corresponding redundant word line can be refreshed in a manner similar to the normal word line.

Incidentally, since the number of the redundant word lines is two in the present example, a signal indicative of which redundant word line should be selected, may be one bit of the fresh address signal BX0_R. However, when the number of the redundant word lines increases more than two, another bit may be used. When the number of the redundant word lines is four, for example, two bits for the refresh address signals BX0_R and BX1_R may be used. In this case, the period of the refresh address counter reaches 16+4=20 cycles.

Figure 5:
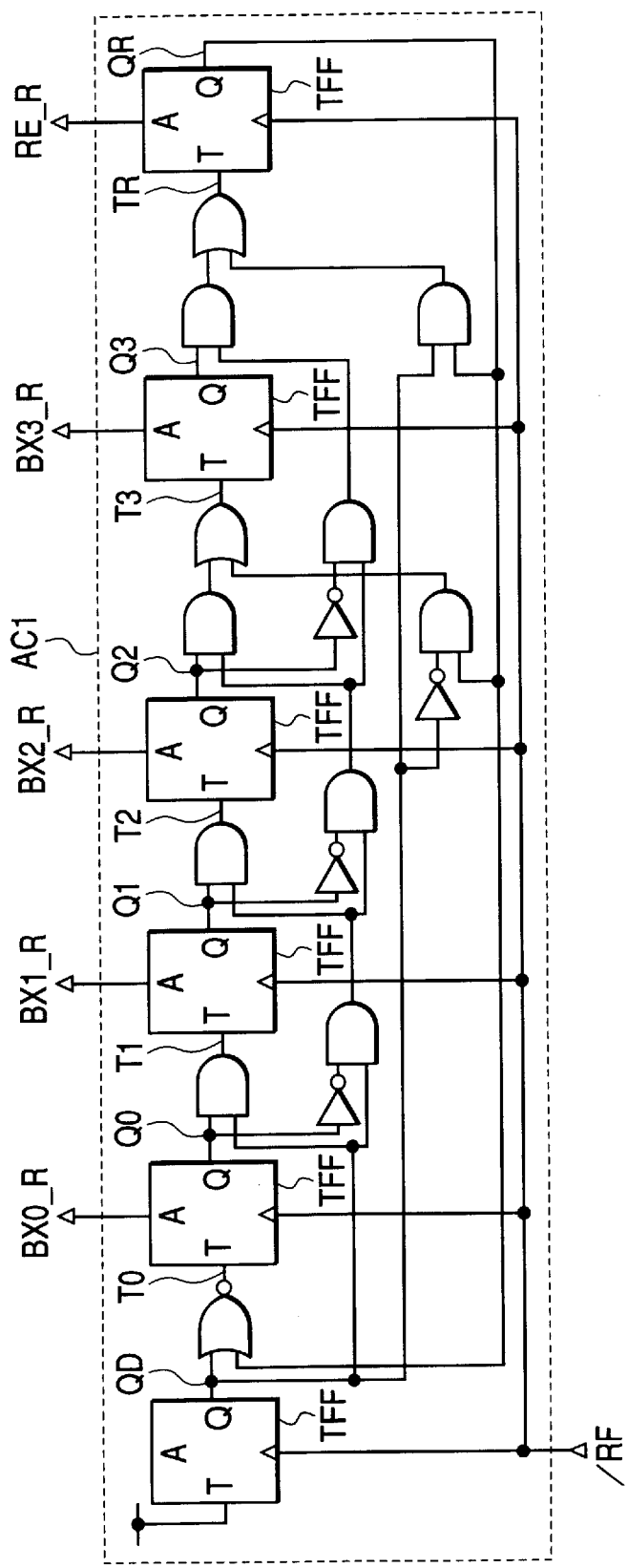
FIG. 5 is a circuit diagram showing another embodiment of the refresh address counter AC1 shown FIG. 1.
Figure 6:
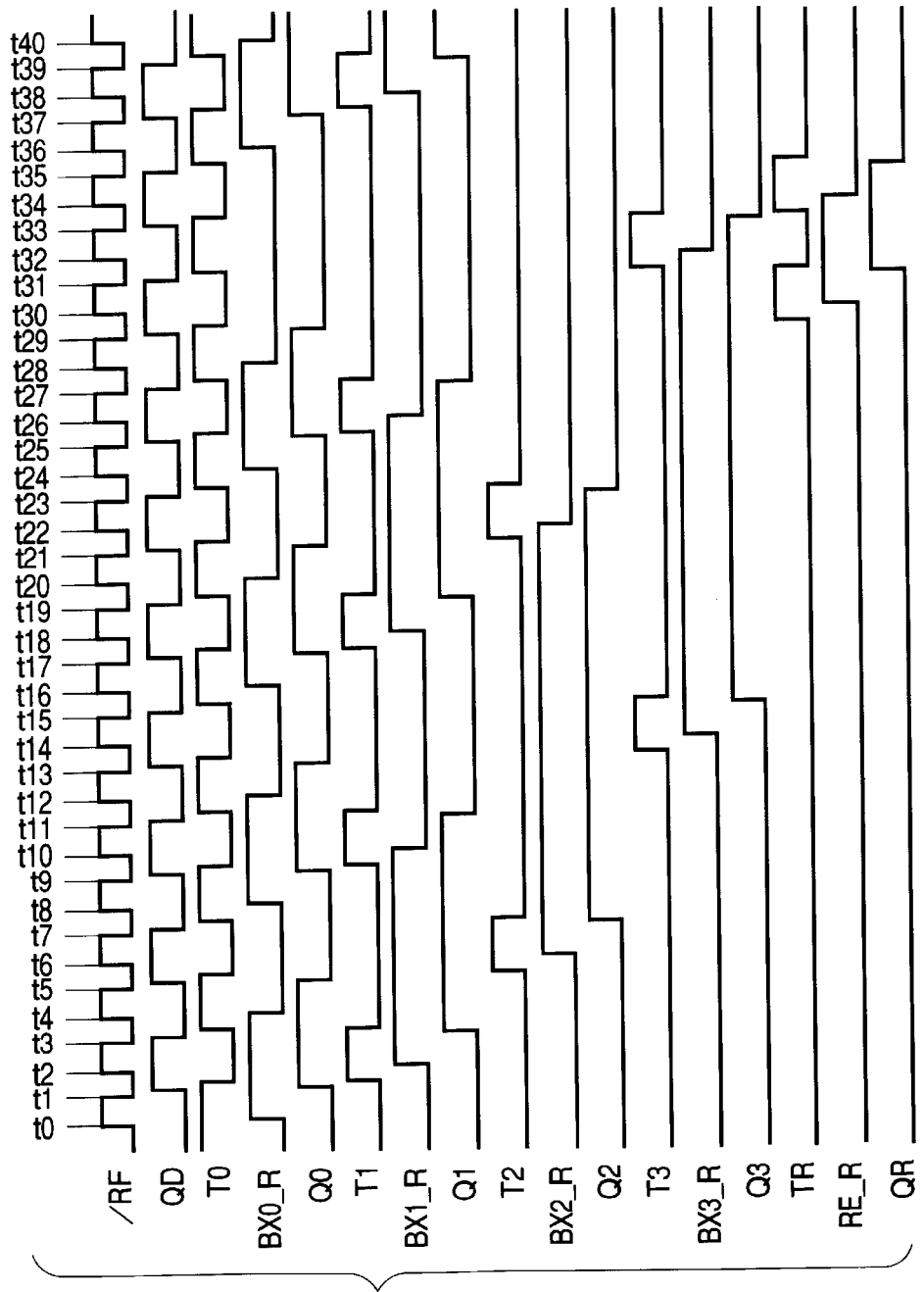
FIG. 6 is an operation waveform diagram for describing the operation of the refresh address counter AC1 shown in FIG. 5.

A circuit diagram of another embodiment of the refresh address counter AC1 shown in FIG. 1 is shown in FIG. 5. The circuit showing the present embodiment comprises (k+3) T flip-flops TFF and number of logic gates. For simplicity, the present drawing shows a case in which k=3. An operation waveform diagram thereof is shown in FIG. 6, and a diagram showing the relationship between outputs of the counter in respective cycles and refreshed word lines is shown in FIG. 7. In the present embodiment, the refresh address counter AC1 is a so-called grey-code counter characterized in that only one output changes during one cycle. This will become apparent by reference to FIG. 7. It is therefore possible to reduce power consumption incident to the charge of output signals BX0_R through BX3_R.

Owing to the adoption of the grey-code counter, the sequence of changes in the refresh address signals BX3_R through BX0_R varies. In a decoder for decoding them, the sequence of selected word lines is different from the embodiment of FIG. 2. However, since their operations per se are similar to the above, the description thereof will be omitted.

Figure 8:
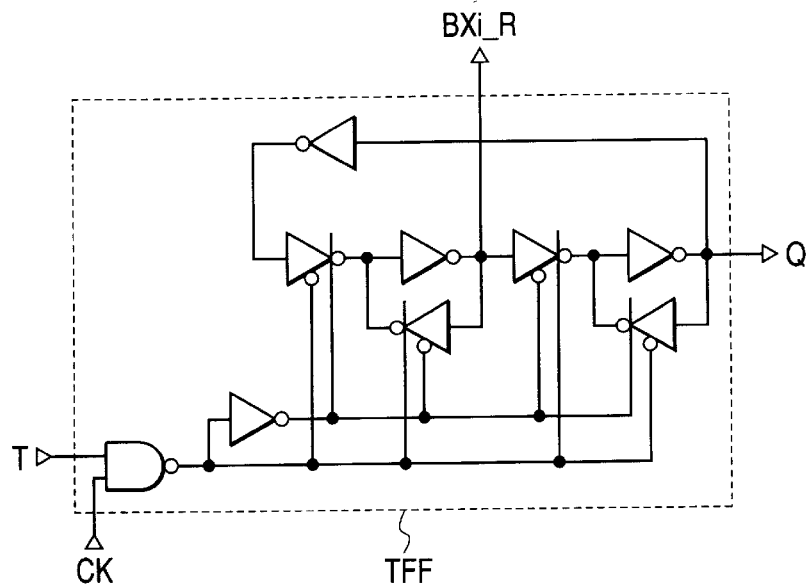
FIG. 8 is a circuit diagram illustrating one embodiment of a flip-flop TFF employed in each of the refresh address counters AC1 shown in FIGS. 2 and 5.

A circuit diagram of one embodiment of a flip-flop TFF employed in the refresh address counter AC1 is shown in FIG. 8. The flip-flop TFF employed in the present embodiment can be used in the binary counter like the embodiment of FIG. 2 or the grey-code counter like the embodiment of FIG. 5. Namely, when an input T is taken as "1", an output Q changes on the falling edge of a clock CK. When the input T is given as "0", the output Q remains unchanged. An output BXi_R is earlier by a half cycle than the output Q, i.e., it changes on the rising edge of the clock CK.

Figure 9:
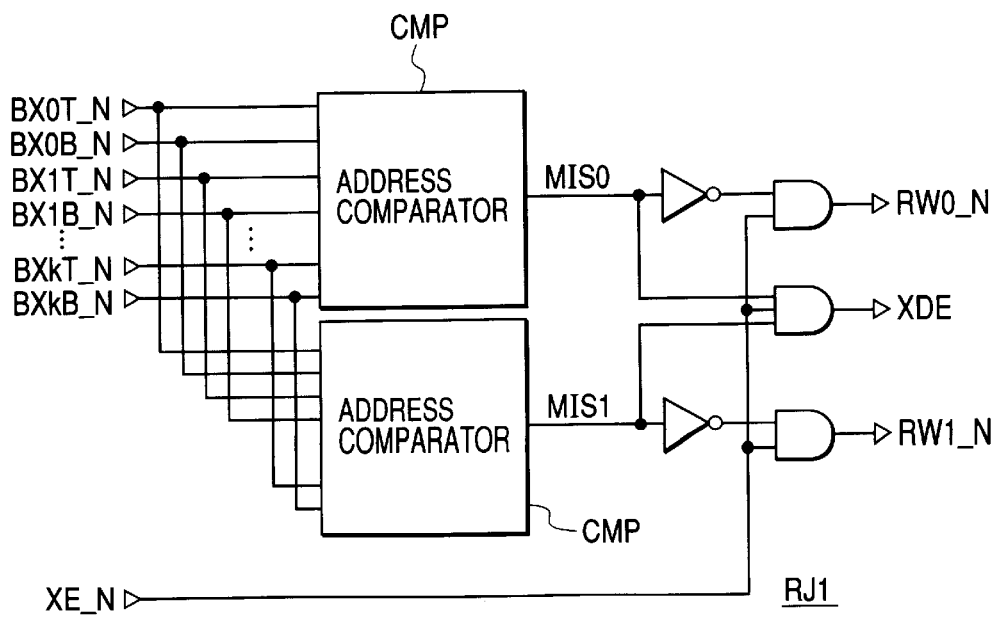
FIG. 9 is a circuit diagram showing one embodiment of a redundant judgement circuit RJ shown in FIG. 1.

A circuit diagram of one embodiment of the redundant judgement circuit RJ1 shown in FIG. 1 is illustrated in FIG. 9. In the same drawing, CMP indicate address comparators, each of which compares an internal address signal BXi_N (0 to k) and an address for a defective word line, which has been stored in the circuit. Each of the address comparators CMP has a programmable non-volatile memory to store each defective address. This can be implemented by a laser-cut fuse, an electrically-cut fuse or an element such as an antifuse. Since its implementing method is already known to date, the description thereof is omitted.

In the present embodiment, two address comparators are illustrated as typical. The internal address signal BXi_N (where i=0 to k) is used to perform comparison with two pairs of defective word line addresses simultaneously. Incidentally, while the internal address signal has been described as BXi_N for simplicity in the above description, a pair of complementary signals of BXiT_N and BXiB_N is actually used as indicated herein. When an external address signal Ai is "0", BXiT_N is "0" and BXiB_N is "1", respectively. When the external address signal Ai is "1", BXiT_N is "1" and BXiB_N is "0", respectively. Upon standby, however, both are "1".

A signal XE_N is a timing signal for determining timing provided to allow each word line to rise at read/write. The signal XE_N is brought from "0" to "1" with predetermined timing. Outputs MISO and MIS1 produced from the address comparators are both "0" upon standby. When the results of comparison are found not to coincide with each other, they are brought from "0" to "1". When they are found to coincide with each other, they remain at "0". Thus, when the results of comparison by the two address comparators are all found to be "inconsistent", a signal XDE results in "1", and signals RW0_N and RW1_N still remain at "0". When any of them is found to take "coincidence", the signal RW0_N or RW1_N results in "1", and the signal XDE remains at "0".

Figure 10:
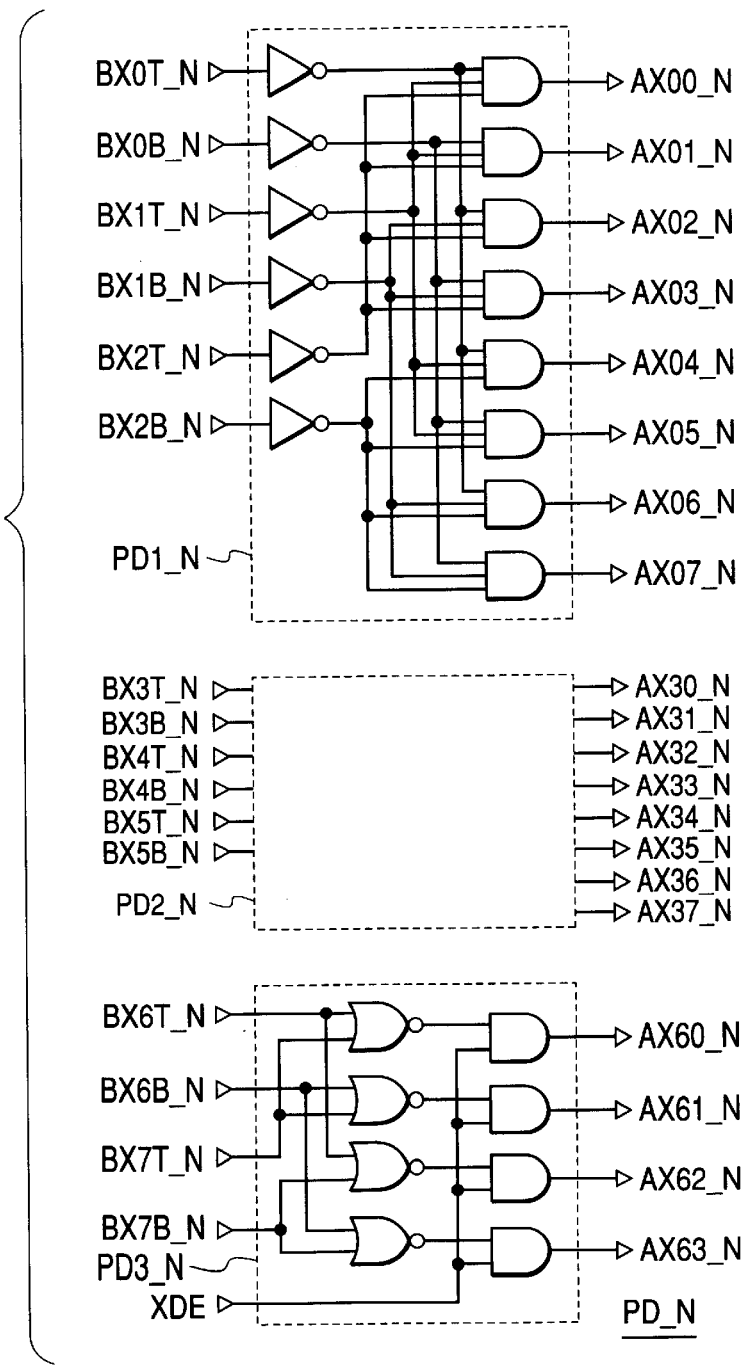
FIG. 10 is a circuit diagram depicting one embodiment of a predecoder PD_N for a read/write operation, which is shown in FIG. 1.

A circuit diagram of one embodiment of the predecoder PD_N for the read/write operation shown in FIG. 1 is illustrated in FIG. 10. The present embodiment shows a case in which k=7. Namely, an internal address signal BXi_N is defined as complementary address signals comprising 8 bits of BX0_N through BX7_N.

A predecoder circuit employed in the present embodiment comprises three sets of predecoders PD1_N, PD2_N and PD3_N. Since PD2_N is identical in configuration to PD1_N illustratively shown as a typical one, the description thereof is omitted. It is shown as a black box.

The predecoder PD1_N predecodes complementary address signals BX0T_N, BX0B_N through BX2T_N, and BX2B_N corresponding to lower 3 bits of an address signal to thereby generate eight types of predecode signals AX00_N through AX07_N. Since the input signals BX0T_N, BX0B_N through BX2T_N and BX2B_N are all "1" upon standby, all the predecode signals AX00_N through AX07_N are "0".

When the predecoder enters into the read/write operation, either the internal address signal BXiT_N or BXiB_N reaches "0" as described above. Therefore, only one of the predecode signals AX00_N through AX07_N results in "1". The predecoder PD2_N is also similar to the above.

The predecoder PD3_N is a circuit for predecoding complementary address signals BX6T_N/BX6B_N and BX7T_N/BX7B_N corresponding to lower 2 bits of an address signal. However, the present predecoder PD3_N is different from other two predecoders PD1_N and PD2_N in that a signal XDE is inputted thereto. Since the signal XDE reaches "1" when the results of comparison by the above redundant judgement circuit are found to be "inconsistent", only one of predecode signals AX60_N through AX63_N results in "1". Thus, one of normal word lines is activated. Since the signal XDE stays at "0" when they are found to be "coincident", all the predecode signals AX60_N through AX63_N remain at "0". Accordingly, the normal word lines are not activated.

Figure 11:
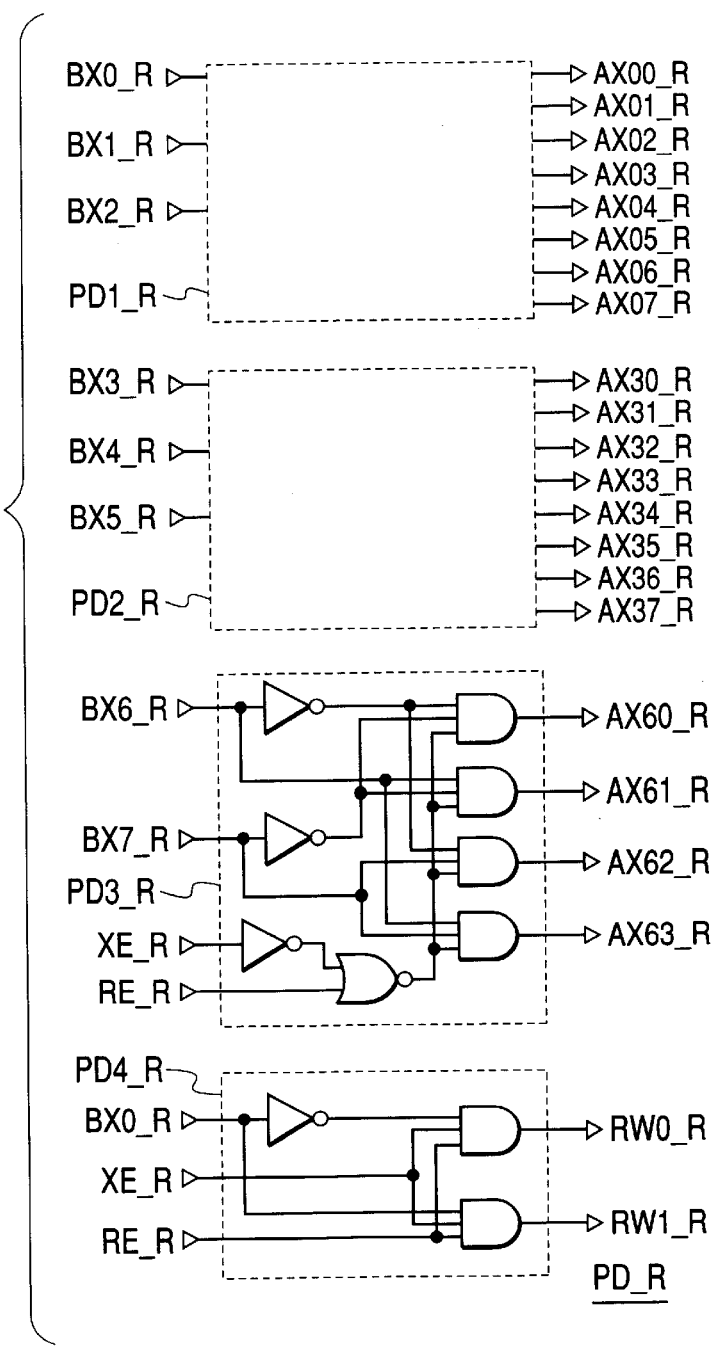
FIG. 11 is a circuit diagram showing one embodiment of a predecoder PD_R for a refresh operation, which is shown in FIG. 1.

A circuit diagram of one embodiment of the predecoder PD_R for the refresh operation shown in FIG. 1 is illustrated in FIG. 11. The present embodiment also shows a case in which k=7 in a manner similar to FIG. 10. The circuit showing the present embodiment comprises four sets of predecoders PD1_R, PD2_R, PD3_R and PD4_R. The predecoders PD1_R and PD2_R are respectively circuits for decoding lower 3 bits (BX0_R through BX2_R) of addresses and intermediate or middle 3 bits (BX3_R through BX5_R). Since these can be implemented by the known 3-bit decoders like the predecoders PD1_N and PD2_N shown in FIG. 10, the description of their configurations is omitted and they are shown as black boxes.

While the predecoder PD3_R is a circuit for predecoding upper 2 bits (BX6_R and BX7_R) of refresh addresses, the predecoder PD3_R is different from the two predecoders PD1_R and PD2_R in that signals RE_R and XE_R are inputted thereto. The signal RE_R is a redundant enable signal corresponding to the output of the refresh address counter as described above.

The XE_R is a timing signal for determining timing provided to raise the corresponding word line upon refresh. The XE-R is brought from "0" to "1" with predetermined timing. The timing is earlier than the signal XE_N. This is because since the redundant judgment is not performed upon refresh, the word line to be selected can be decided earlier by a time spent for its judgement in the present embodiment. When the signal RE_R is "0", only one of the predecode signals AX60_R through AX63_R results in "1" with timing in which the XE_R reaches "1". Thus, one of the normal word lines is activated. When the signal RE_R is of "1", all of the predecode signals AX60_R through AX63_R remain at "0". Accordingly, the normal word lines are not activated.

The predecoder PD4_R is a circuit for generating redundant word line activation signals RW0_R and RW1_R in response to the refresh address signals BX0_R and the signal RE_R. When the signal RE_R is "0", the redundant word line activation signals RW0_R and RW1_R both remain at "0". Accordingly, no redundant word lines are activated. When the signal RE_R is "1" and the refresh address signal BX0_R is "0", the redundant word line activation signal RW0_R results in "1" with timing in which the signal XE_R reaches "1". Thus, the corresponding redundant word line RW0 is activated. When the signal RE_R is "1" and the refresh address signal BX0_R is "1", the redundant word line activation signal RW1_R results in "1" with timing in which the signal XE_R reaches "1". Thus, the corresponding redundant word line RW1 is activated.

Figure 12:
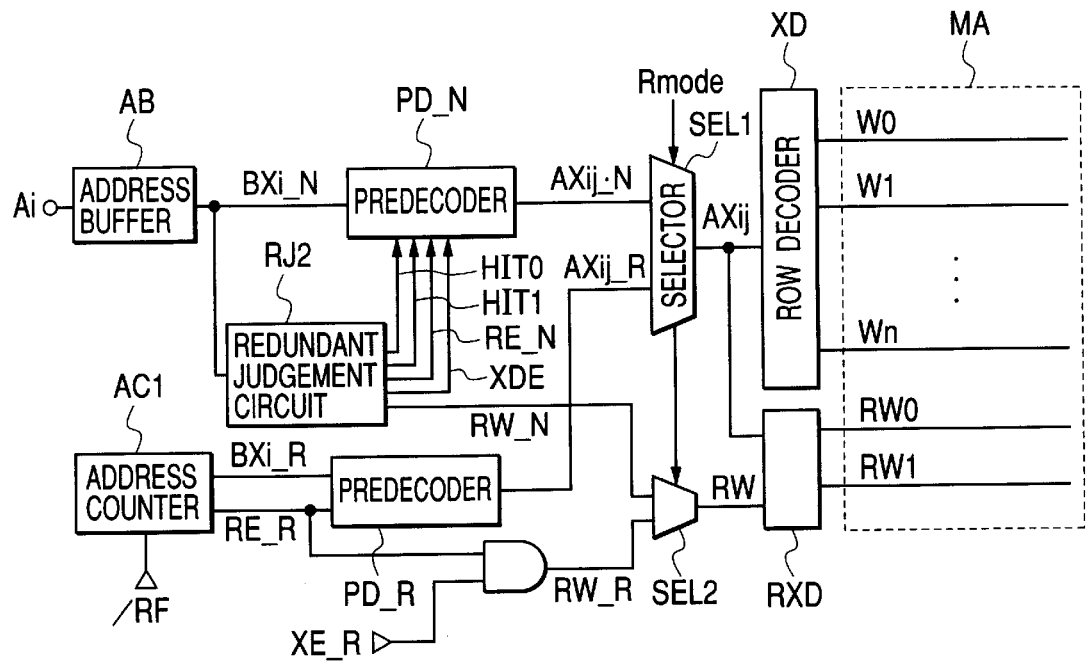
FIG. 12 is a schematic block diagram showing another embodiment of a DRAM according to the present invention.

A schematic block diagram of another embodiment of a DRAM according to the present invention is shown in FIG. 12. In the same drawing, the same reference numerals as those employed in the embodiment shown in FIG. 1 indicate the same or corresponding components respectively. The present embodiment is different from the embodiment shown in FIG. 1 in that a selector SEL2 for redundant word selection is provided one alone, and a decoder RXD for redundant word line selection s provided. Only one RW is provided as a redundant word line activation signal sent from the selector SEL2 to the decoder RXD. Predecode signals AX00 and AX01 are used for identification indicative of which of two redundant word lines RW0 and RW1 should be activated. The redundant word line decoder RXD activates the redundant word line RW0 when the signal RW and the predecode signal AX00 are "1". When the signal RW and the predecode signal AX01 are "1", the redundant word line RW1 is activated.

The present embodiment is characterized in that one redundant word line activation signal may be used. In the embodiment shown in FIG. 1, the two RW0 and RW1 were provided as the redundant word line activation signals. This is because the two redundant word lines RW0 and RW1 are provided. On the other hand, in the present embodiment, the number of wirings may be one despite the fact that the number of the redundant word lines is two. While the number of the redundant word lines is two in the present example for simplicity, a reduction in the number of wirings greatly contributes to a reduction in chip area when the number of the redundant word lines increases in large numbers. With the above changes, some changes occur even in the redundant judgement circuit and each predecoder.

Figure 13:
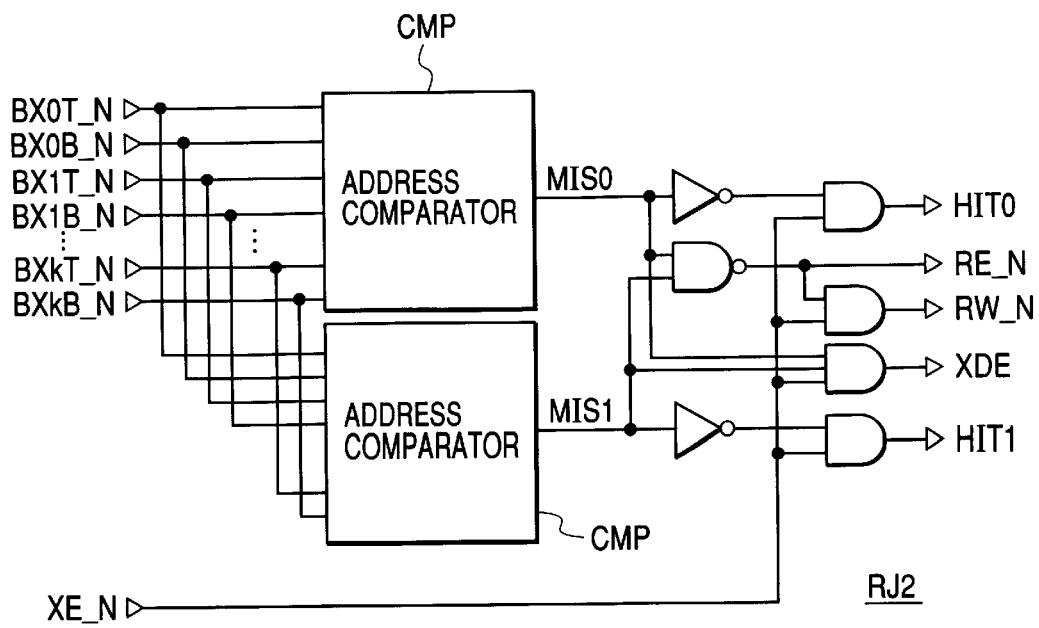
FIG. 13 is a circuit diagram showing another embodiment of the redundant judgement circuit RJ.

A circuit diagram of another embodiment showing a redundant judgement circuit RJ2 is illustrated in FIG. 13. Points of difference between a circuit of the present embodiment and the circuit of the embodiment shown in FIG. 9 are as follows. A first point of difference is that as an alternative of the redundant word line activation signals RW0__N and RW1__N, an OR signal RW__N for them is outputted. This signal RW__N results in "1" when any one of the redundant word lines RW0 and RW1 is to be activated.

A second point of difference is that signals HIT0 and HIT1 indicating that the results of comparison by address comparators CMP show "coincidence" are outputted. The signals HIT0 and HIT1 are both "0" upon standby. When the results of comparison are brought to "coincidence", either HIT0 or HIT1 is brought to "1" with timing of a signal XE__N. When the results of comparison are all brought to "non-coincidence", both remain at "0".

A third point of difference is that a redundant enable signal RE__N is outputted. The redundant enable signal RE__N is "1" upon standby, and remains at "1" when one of the results of comparison by the address comparators CMP shows "coincidence". When all the results of comparison take "non-coincidence", the redundant enable signal RE__N is brought to "0". The signal RW__N passes through the selector SEL2 and is then used to select the corresponding redundant word line. The signals HIT0, HIT1 and RE__N are used in a predecoder PD__N to be next described.

Figure 14:
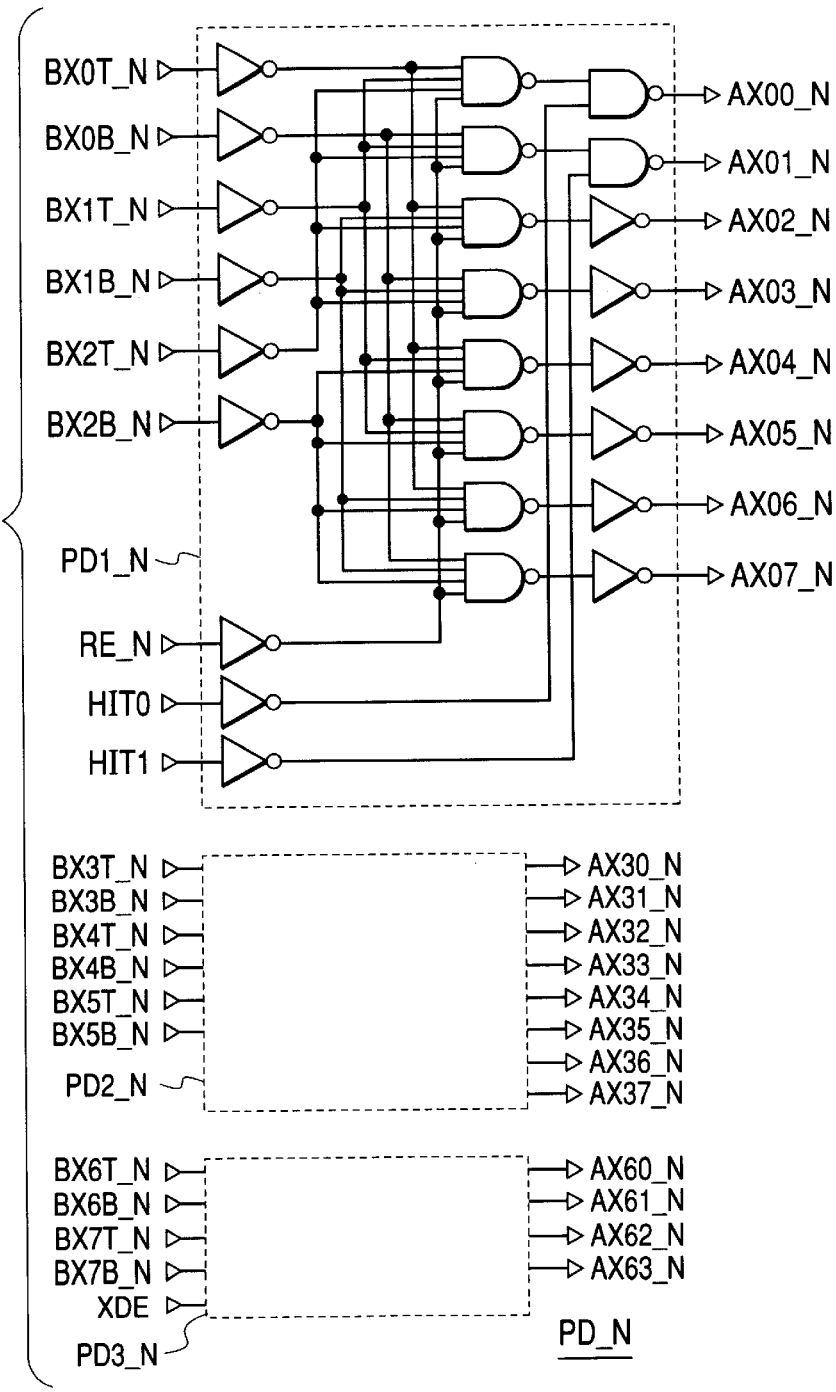
FIG. 14 is a circuit diagram illustrating another embodiment of the predecoder PD_N for the read/write operation.

A circuit diagram of another embodiment of the predecoder PD__N for the read/write operation is shown in FIG. 14. The present embodiment also shows a case in which k=7. The present circuit comprises three sets of predecoders PD1__N, PD2__N and PD3__N. Since the predecoders PD2__N and PD3__N are identical in configuration to those shown in FIG. 10, the description thereof is omitted. They are represented as black boxes.

The operation of the predecoder PD1__N will next be explained. When all of the results of comparison by such address comparators CMP as described above show "inconsistency", a signal RE__N is "0" and HIT0 and HIT1 are "0". Therefore, lower 3 bits of addresses are predecoded to generate predecode signals AX00__N through AX07__N. When the results of comparison by the address comparators CMP show "coincidence", the signal RE__N results in "1" and HIT0 and HIT1 result in "1".

Thus, regardless of address input signals BXiT__N and BXiB__N (where i=0 to 2), the predecode signal AX00__N is brought to "1" when the signal HIT0 is "1", whereas when the signal HIT1 is "1", the predecode signal AX00__N becomes "1". Other predecode signals AX02__N through AX07__N remain at "0". Since the operations of the predecoders PD2__N and PD3__N are identical to FIG. 10, the description thereof is omitted. Incidentally, since a predecoder PD__R for a refresh operation is identical to FIG. 11, the description thereof is omitted. However, the predecoder PD4__R for generating the redundant word line activation signals RW0__R and RW1__R is unnecessary.

Figure 15:
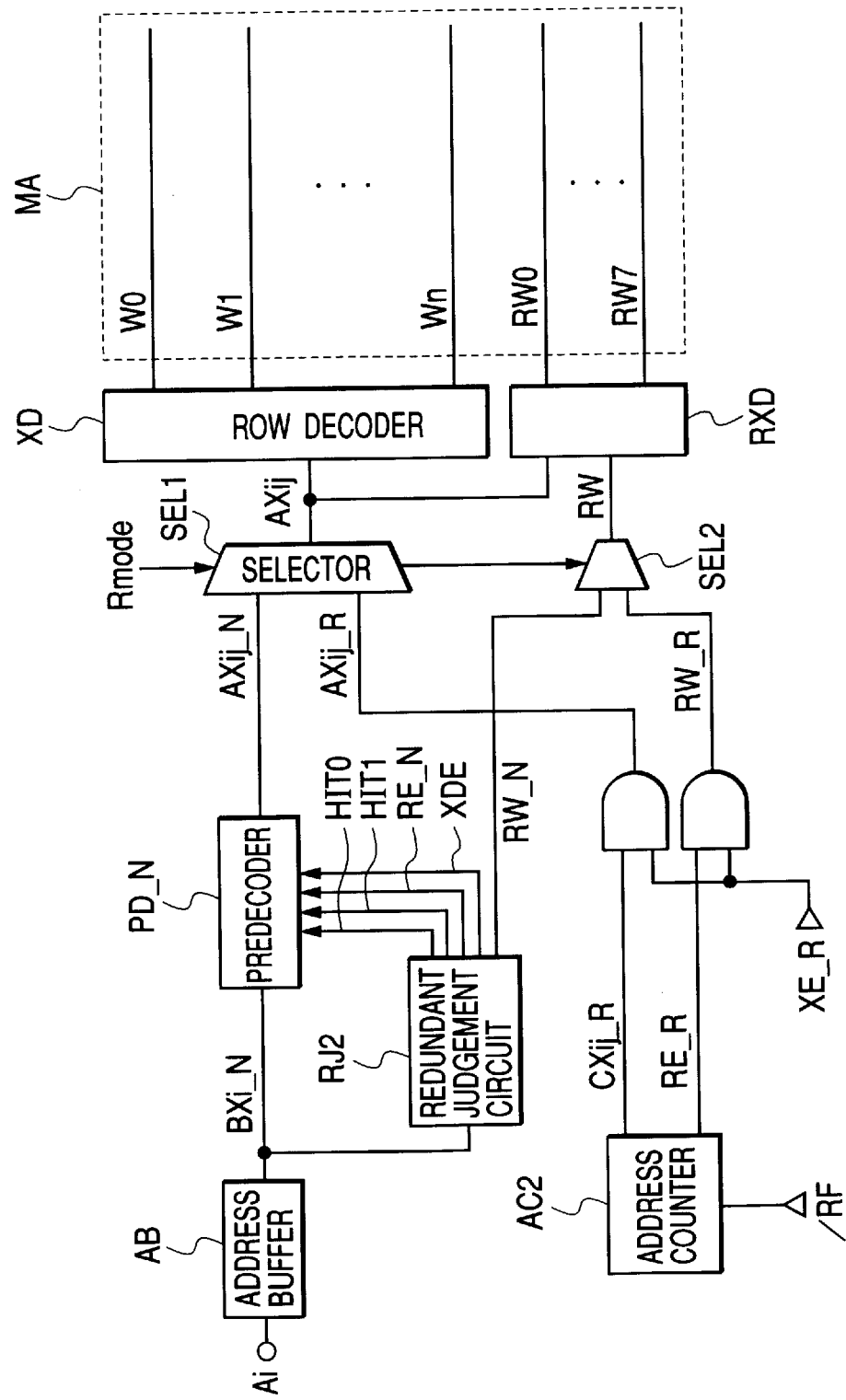
FIG. 15 is a schematic block diagram showing a further embodiment of a DRAM according to the present invention.

A schematic block diagram of a further embodiment of a DRAM according to the present invention is shown in FIG. 15. In the same drawing, the same reference numerals as those shown in the embodiments shown in FIGS. 1 and 12 indicate the same or corresponding portions or components.

A first feature of the present embodiment is that a shift register type circuit AC2 is adopted as a refresh address counter. Each of the embodiments shown in FIGS. 1 and 12 is of such a type that the refresh address signal BXi__R is generated by the refresh address counter AC1 and predecoded by the predecoder PD__R to generate the predecode signal AXij__R.

In the present embodiment, a predecoded signal AXij__R (to put it more precisely, a predecoded signal CXij__R and a timing signal XE__R are ANDed to obtain AXij__R). Thus, since the predecoder PD__R is unnecessary, a circuit scale can be reduced and power consumption can be lessened too.

A second feature of the present embodiment is that four word lines (one word line in the embodiments shown in FIGS. 1 and 12) are used as word line substitution units. Namely, while eight RW0 through RW7 are adopted as redundant word lines, redundant word lines RW0 through RW3 and RW4 through RW7 are respectively simultaneously replaced by normal word lines. A first advantage brought about by it resides in that it is easy to cope with a case in which adjacent word lines are simultaneously made defective like shorts between the word lines. A second advantage is that the present embodiment is suited to a hierarchical word line type. Main circuits that constitute the DRAM according to the present embodiment, will next be described in detail using drawings.

Figure 16:
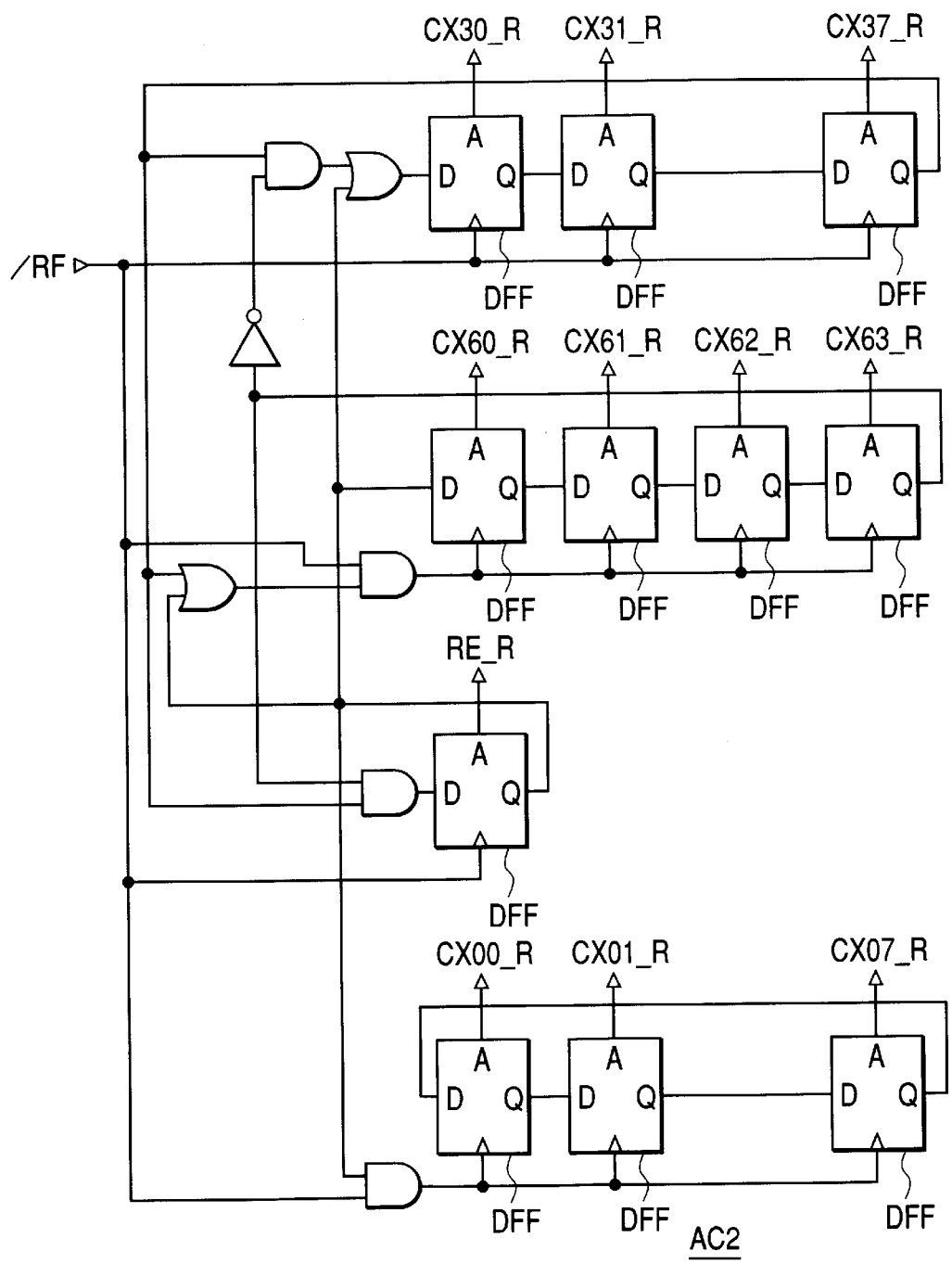
FIG. 16 is a circuit diagram illustrating one embodiment of a refresh address counter AC2 shown in FIG. 15.

A circuit diagram of one embodiment of a refresh address counter AC2 is shown in FIG. 16. The same drawing is also equivalent to k=7. The present circuit comprises 21 D flip-flops DFF and number of logic gates. /RF indicates a refresh signal. The refresh signal /RF is brought to "0" upon the start of a refresh operation, and reaches "1" when the refresh operation is completed. Eight flip-flops DFF, which are provided in the top stage in the drawing, are connected in a ring form and respectively generate output signals CX30__R through CX37__R. Four flip-flops DFF corresponding to a second stage are also connected in a ring form and respectively generate outputs CX60__R through CX63__R. One flip-flop DFF corresponding to a third stage generates a redundant enable signal RE__R. Eight flip-flops DFF provided in the lowermost stage are connected in a ring form and respectively generate CX00__R through CX07__R.

Figure 17:
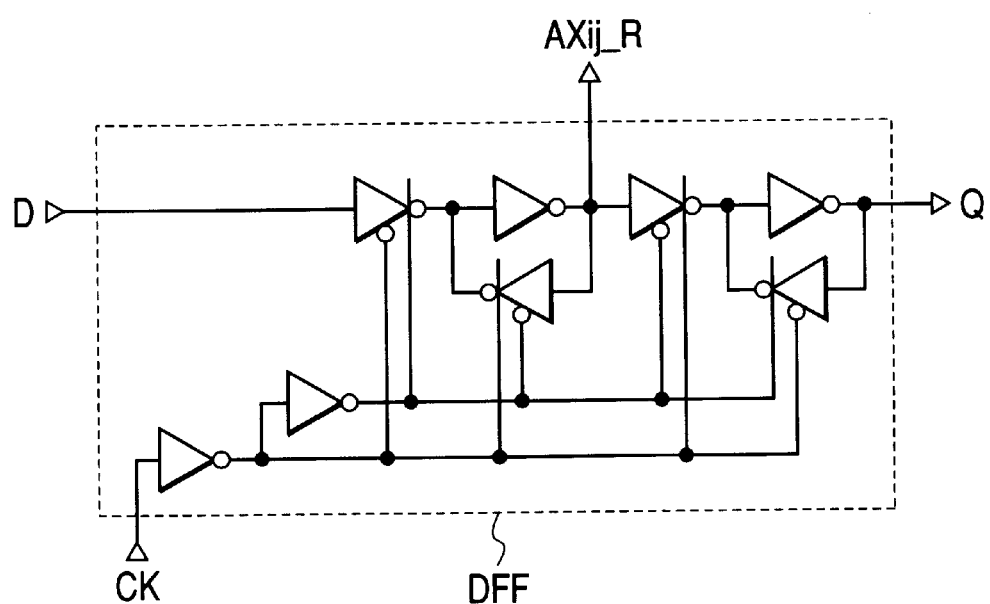
FIG. 17 is a circuit diagram showing one embodiment of a flip-flop DFF shown in FIG. 16.

A circuit diagram of one embodiment of the flip-flop DFF shown in FIG. 16 is illustrated in FIG. 17. An output Q changes in response to the falling edge of a clock CK, and an output CXij__R is earlier by a half cycle than the output Q, i.e., it changes on the rising edge of the clock CK.

Figure 18:
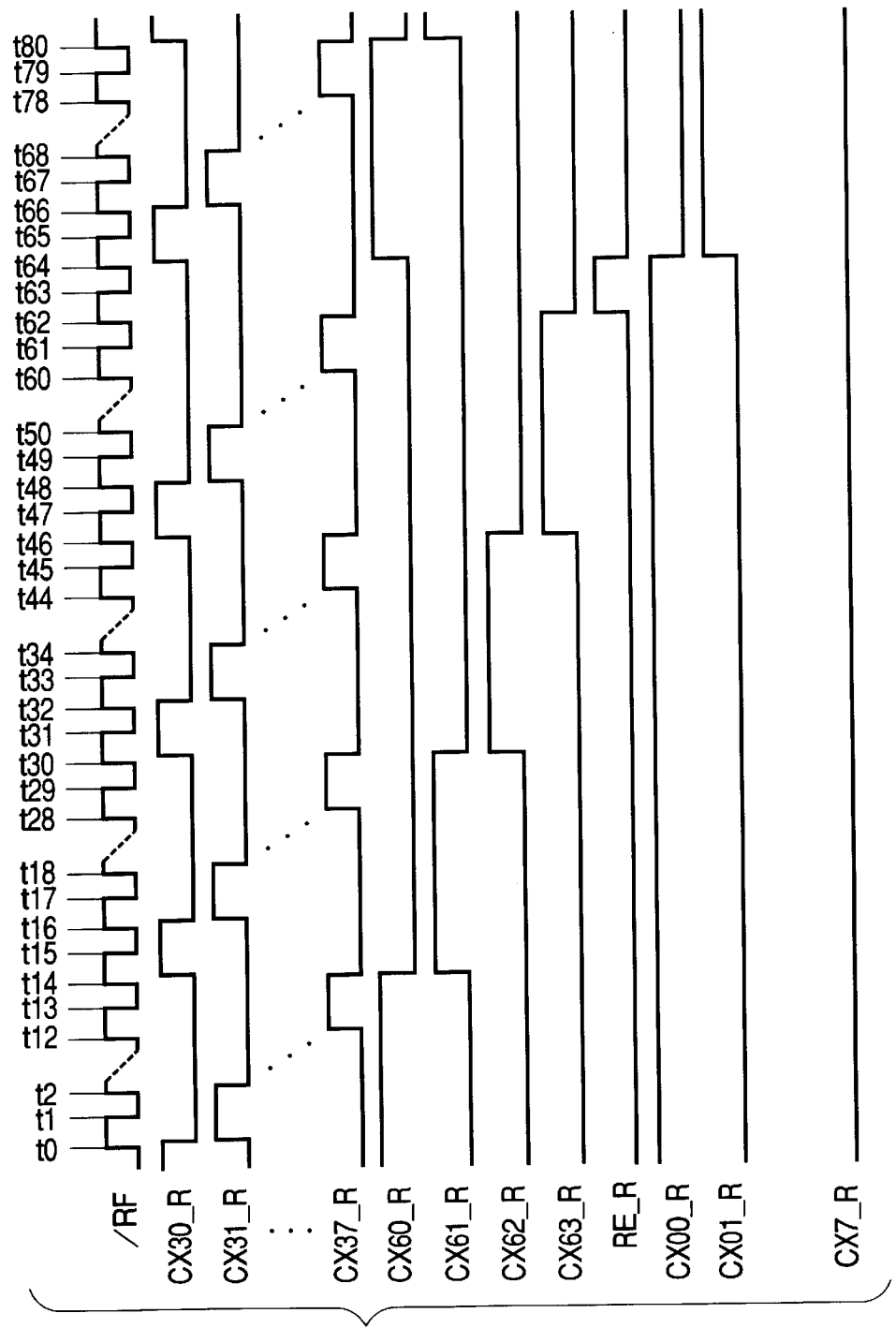
FIG. 18 is an operation waveform diagram for describing the refresh address counter shown in FIG. 16.

An operation waveform diagram for describing the refresh address counter shown in FIG. 16 is shown in FIG. 18. In an initial state, only the outputs CX30__R, CX60__R and CX00__R are respectively brought to "1", and others are brought to "0". In this state, the refresh of a word line W0 corresponding to an address "000" (octal representation) is executed.

When the signal /RF rises at a time t0, the signal CX30__R results in "0" and the signal CX31__R is brought to "1". CX60__R and CX00__R remain at "1". Accordingly, the refresh of a word line W8 corresponding to an address "010" is executed from times t1 to t2.

When the signal /RF rises at the time t2, CX31__R results in "0" and CX32__R is brought to "1". Accordingly, the refresh of a word line W16 corresponding to an address "020" is executed from times t3 to t4. Addresses are advanced similarly subsequently, and the refresh of a word line W56 corresponding to an address "070" is executed from times t13 to t14.

When the signal /RF rises at the time t14, CX37_R is brought to "0" and CX30_R is brought to "1". Further, CX60_R is brought to "0" and CX61_R is brought to "1". Accordingly, the refresh of a word line W64 corresponding to an address "100" is executed from times t15 to t16. Addresses are advanced subsequently in the same manner, and normal word lines are refreshed every eight lines. The refresh of a word line W248 corresponding to an address "370" is executed from times t61 to t62.

When the signal /RF rises at the time t62, all of CX30_R through CX37_R and CX60_R through CX63_R are brought to "0", and the redundant enable signal RE_R results in "1". Thus, the refresh of a redundant word line RW0 is executed from times t63 to t64.

When the signal /RF rises at the time t64, the signal RE_R is brought to "0", and CX30_R and CX60_R are brought to "1", CX00_R is brought to "0" and CX01_R is brought to "1", respectively. Thus, the refresh of a word line W1 corresponding to an address "001" is executed from times t65 to t66. The normal word lines are refreshed again every eight lines in a manner similar to the above. The above is summarized as such a relational diagram as shown in FIG. 19. Since the redundant judgement circuit RJ2 employed in the present embodiment may be the same as the circuit shown in FIG. 13, the description thereof is omitted.

Figure 20:
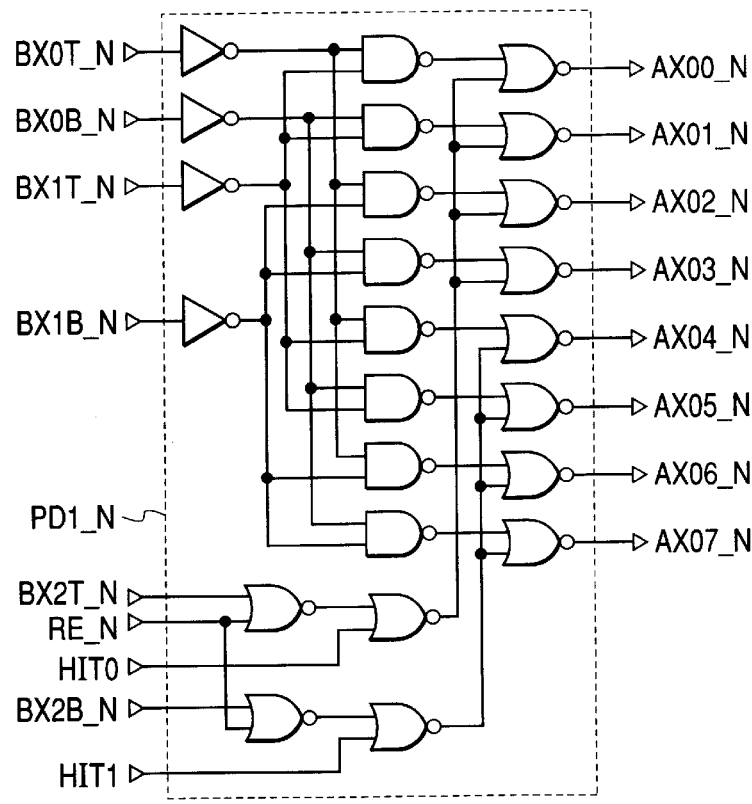
FIG. 20 is a circuit diagram illustrating a further embodiment of the predecoder PD_N for the read/write operation according to the present invention.

A circuit diagram of a further embodiment of the predecoder PD_N for the read/write operation according to the present invention is shown in FIG. 20. The present embodiment also shows a case in which k=7. The present circuit comprises three sets of predecoders PD1_N, PD2_N and PD3_N. Since the predecoders PD2_N and PD3_N of these are identical to the embodiment of FIG. 14, the description thereof is omitted.

The operation of the predecoder PD1_N will next be explained. When the results of comparison by such address comparator as described above all show "non-coincidence", a signal RE_N is "0" and signals HIT0 and HIT1 are "0". Therefore, lower 3 bits of addresses are predecoded to generate predecode signals AX00_N through AX07_N. When the results of comparison by the address comparators CMP show "coincidence", the signal RE_N results in "1" and the signals HIT0 and HIT1 result in "1".

When the signal HIT0 is "1", any one of AX00_N through AX03_N results in "1" and others result in "0" by address input signals BXiT_N and BXiB_N (where i=0, 1). When address signals BX0B_N and BX1B_N are "1", for example, AX00_N is brought to "1". When the signal HIT1 is "1", any one of AX04_N through AX07_N is brought to "1" and others are brought to "0" by the address signals BXiT_N and BXiB_N (where i=0, 1). When the address signals BX0B_N and BX1B_N are "1", for example, AX04_N results in "1". In either case, address signals BX2T_N and BX2B_N are neglected.

In a manner similar to the second embodiment of FIG. 12, the present embodiment has an advantage in that only one redundant word line activation signal is used and the number of wirings is reduced. The predecode signals AX00 through AX07 are used for identification indicative of which one of eight redundant word lines should be activated.

Figure 21:
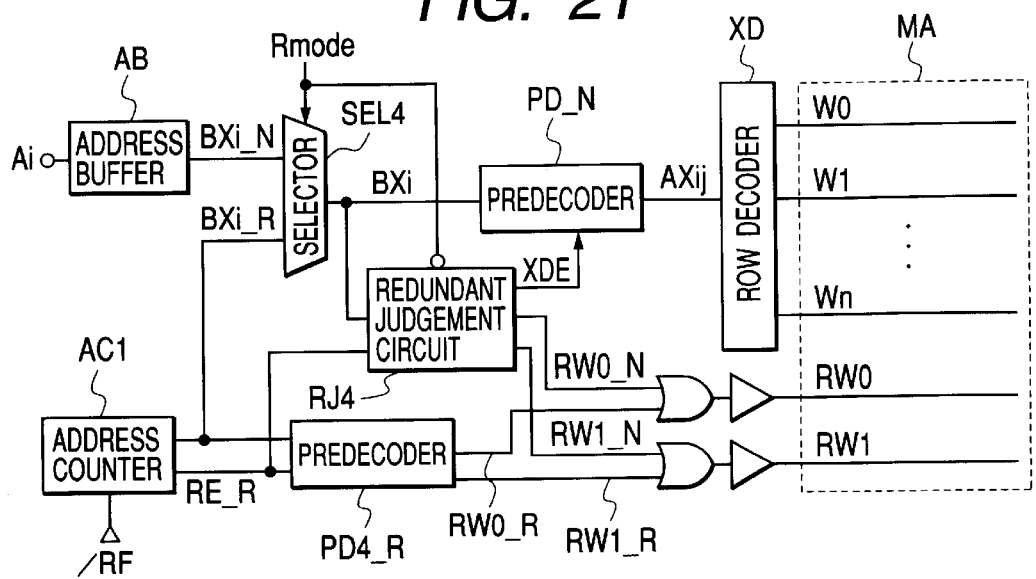
FIG. 21 is a schematic block diagram showing a still further embodiment of a DRAM according to the present invention.

A schematic block diagram of a still further embodiment of a DRAM according to the present invention is shown in FIG. 21. In the same drawing, the same reference numerals as those in the embodiments of FIG. 1, FIG. 12 and the like indicate the same or corresponding portions or components respectively. In the present embodiment, a selector SEL4 is inserted in a stage prior to a predecoder. Namely, the selector SEL4 selects pro-predecode address signals BXi_N and BXi_R. Since the number of pro-predecode signals is normally fewer than the number of post-predecode signals, a selector can be reduced in circuit scale.

An address signal BXi selected by the selector is transferred to a redundant judgement circuit RJ4. However, the redundant judgment circuit RJ4 does not perform a judgement operation in a refresh mode (when a signal mode Rmode is "1"). Thus, a refresh operation can be speeded up by an operation time for the redundant judgement circuit, and power consumption thereof can be reduced.

Figure 22:
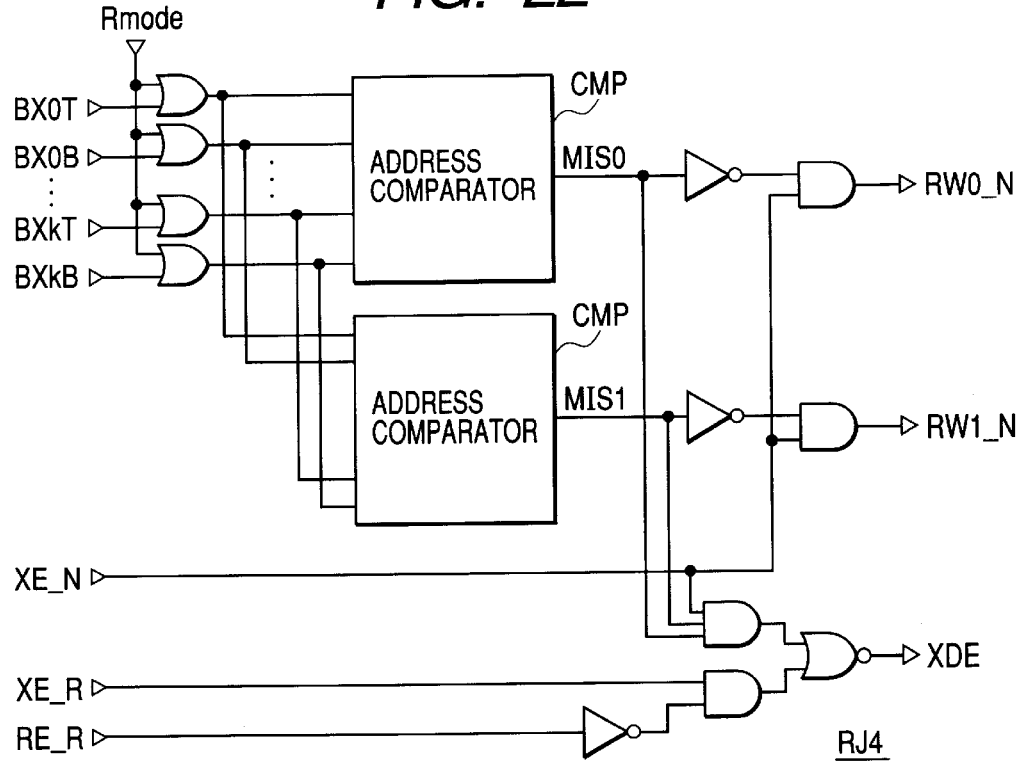
FIG. 22 is a circuit diagram illustrating one embodiment of a redundant judgement circuit RJ4 shown in FIG. 21.

A circuit diagram of one embodiment of the redundant judgement circuit RJ4 shown in FIG. 21 is illustrated in FIG. 22. A first point of difference between the present circuit and the circuit showing the embodiment shown in FIG. 9 resides in that gates for taking ORing (OR) with a refresh mode signal Rmode are provided at portions for inputting address signals BXiT_N and BXiB_N (where i=0 to k). Since the signal Rmode is "1" in a refresh mode, the inputs of address comparators CMP are fixed to "1" and hence the address comparators CMP are not operated. Thus, power consumption necessary for each address comparator CMP becomes unnecessary upon refresh.

A second point of difference therebetween resides in a method of generating a signal XDE. Since a signal XE_R is "0" upon read/write, the generation of the signal XDE is identical to the circuit showing the embodiment of FIG. 9. Namely, when the results of comparison by the address comparators CMP are all indicative of "inconsistence", a signal XE_N results in "1" with timing provided to bring it from "0" to "1".

Upon refresh, the signal XE_N is "0" and the signal XE_R is brought from "0" to "1" with predetermined timing. This timing is earlier than the signal XE_N. Since no redundant judgement is done upon refresh, a word line to be selected can be decided earlier by a time interval spent for it judgement. When the signal RE_R is "0", XDE results in "1" with timing in which the signal XE_R is brought to "1". Thus, one of normal word lines is activated. When the signal RE_R is "1", the signal XDE remains at "0. Accordingly, no normal word lines are activated.

While the method of fixing the input signal has been adopted to deactivate the address comparators CMP upon refresh, another method may be used. For example, a method of turning off a power supply or source for each address comparator CMP may be adopted.

Figure 23:
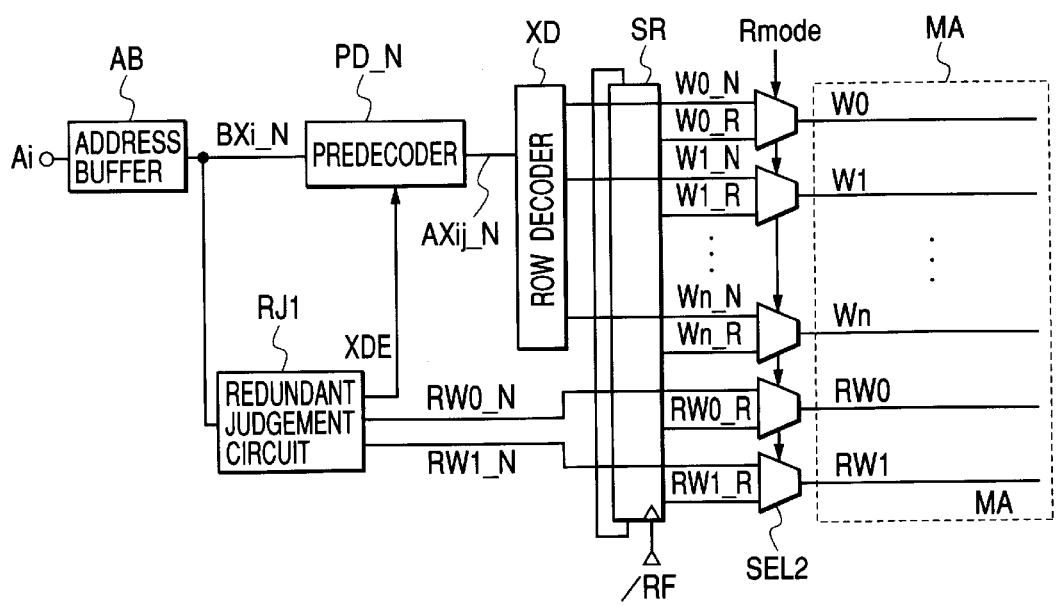
FIG. 23 is a schematic block diagram depicting a still further embodiment of a DRAM according to the present invention.

A schematic block diagram depicting a still further embodiment of a DRAM according to the present invention is shown in FIG. 23. In the same drawing, the same reference numerals as those shown in the embodiments of FIGS. 1 and 12 or the like respectively indicate the same or corresponding portions or components. The present system is characterized in that a shift register SR is used to select each word line upon refresh. The shift register SR directly outputs normal word line activation signals W0 through Wn and redundant word line activation signals RW0 and RW1.

Upon refresh, only one of the normal word line activation signals W0 through Wn and the redundant word line activation signals RW0 and RW1 is brought to "1". The refresh signal /RF is used to shift the shift register SR. The normal word line activation signals W0 through Wn and the redundant word line activation signals RW0 and RW1 are sequentially brought to "1" each time the signal /RF rises. Thus, normal word lines W0 through Wn and redundant word lines RW0 and RW1 are successively refreshed.

Even in the case of the present embodiment, no redundant judgement is done upon refresh. Thus, a refresh operation can be speeded up by an operation time for a redundant judgement circuit, and power consumed or used up by the redundant judgement circuit can be reduced. Since the shift register SR outputs the redundant word line activation signals, memory cells connected to the redundant word lines can also be refreshed in a manner similar to memory cells connected to the normal word lines even if no redundant judgement is done.

Figure 24:
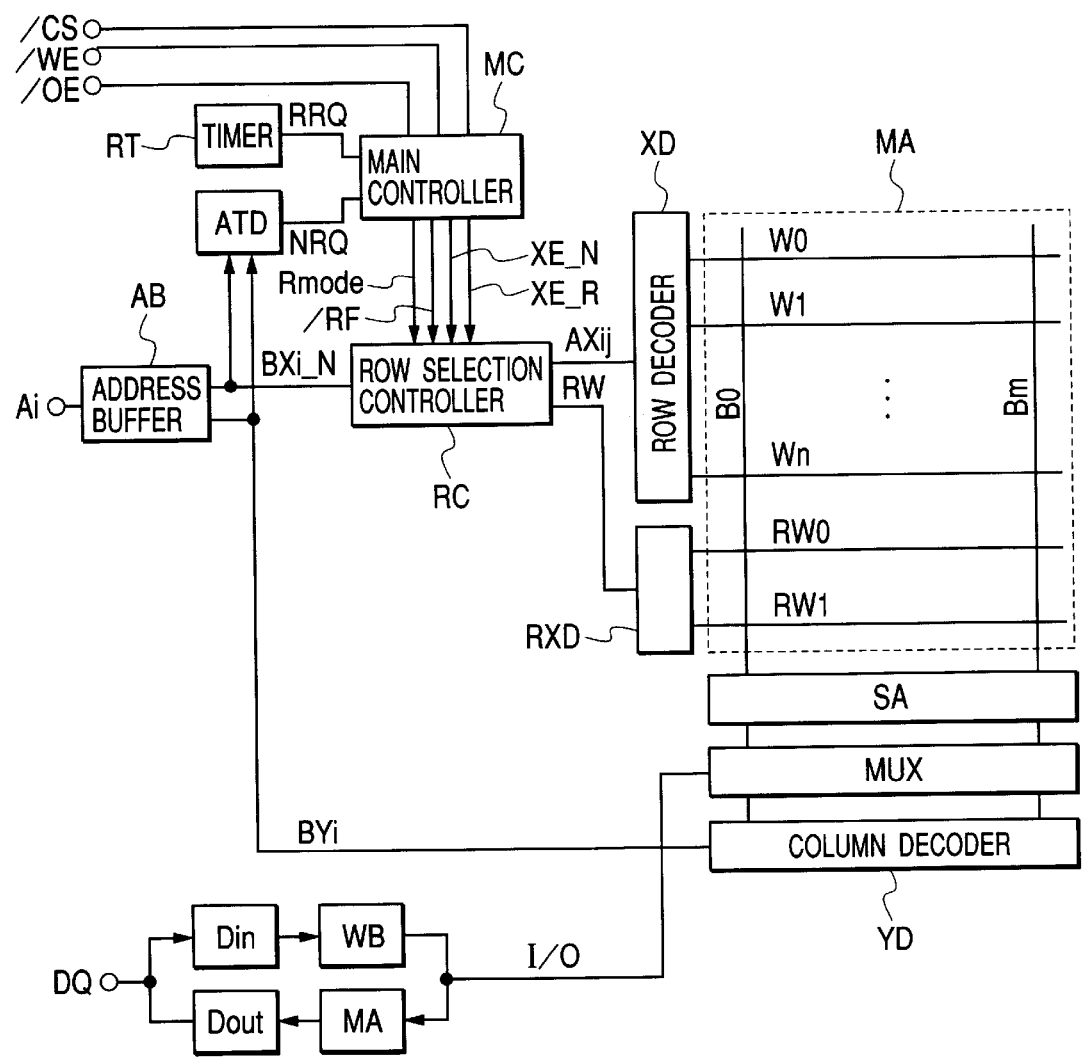
FIG. 24 is a schematic block diagram showing a still further embodiment of a DRAM according to the present invention.

A schematic block diagram of a still further embodiment of a DRAM according to the present invention is shown in FIG. 24. The DRAM showing the present embodiment is intended for a DRAM having an SRAM interface, a so-called pseudo SRAM. RC indicates a row (word line) selection controller according to the present invention, which includes therein a redundant judgement circuit, a predecoder, a refresh address counter, a selector, etc.

AB indicates an address input circuit which receives an external address signal Ai therein and generates an internal row address signal BXi_N and an internal column address signal BYi. ATD indicates an address transition detector, which detects a change in internal address signal and outputs an access request signal NRQ. RT indicates a refresh timer, which outputs a refresh request signal RRQ on a regular basis (every a few µs, for example).

MC indicates a main controller which receives therein signals (commands) such as the signals NRQ and RRQ, a chip select signal /CS, a write enable signal /WE, an output enable signal /OE, etc. and arbitrates the sequence of execution of read/write and refresh. Further, the main controller MC outputs a refresh mode signal Rmode, a refresh signal /RF, timing signals XE_N and XE_R. These signals are used within the row selection controller RC as described above.

XD indicates a row decoder, and RXD indicates a redundant word line decoder, respectively. MA indicates a memory array in which one transistor-type dynamic memory cells (each comprising a storage capacitor and an address selection MOSFET) known to date are disposed at points where word lines W0 through Wn and redundant word lines RW0 and RW1, and bit lines B0 through Bm intersect, respectively. Incidentally, while redundant bit lines are omitted in this drawing, they may be provided as needed.

SA indicates a sense amplifier which amplifies a signal read onto each bit line, YD indicates a column decoder for selecting one bit line in response to the column address signal BYi, MUX indicates a multiplexer for connecting the selected bit line to an input/output data line I/O, MA indicates a main amplifier, Dout indicates a data output buffer, Din indicates a data input buffer, WB indicates a write buffer, and DQ indicates a data input/output terminal, respectively. Incidentally, while I/O, MA, Dout, Din, WB and DQ are respectively described as one in number, they may be of course provided in a plural form (e.g., 4 through 16).

When the signal NRQ is outputted antecedent to RRQ, either reading or writing is executed precedently, and refresh is executed after its completion. In the case of reading, data on a bit line selected by the column decoder is read onto the I/O through the multiplexer MUX and then outputted to the data input/output terminal DQ through the main amplifier MA and the data output buffer Dout. Upon writing, data inputted from the data input/output terminal DQ is written into its corresponding memory cell through the data input buffer Din, the write buffer WB, the I/O, the multiplexer MUX and the selected bit line.

When the signal RRQ is outputted antecedent to NRQ in reverse, refresh is executed precedently, and either reading or writing is executed after its completion. While the sense amplifier is operated upon refresh, the column decoder and circuits about data input/output relations are not operated. Owing to the above operations, the refresh operation can be concealed from outside.

Figure 25:
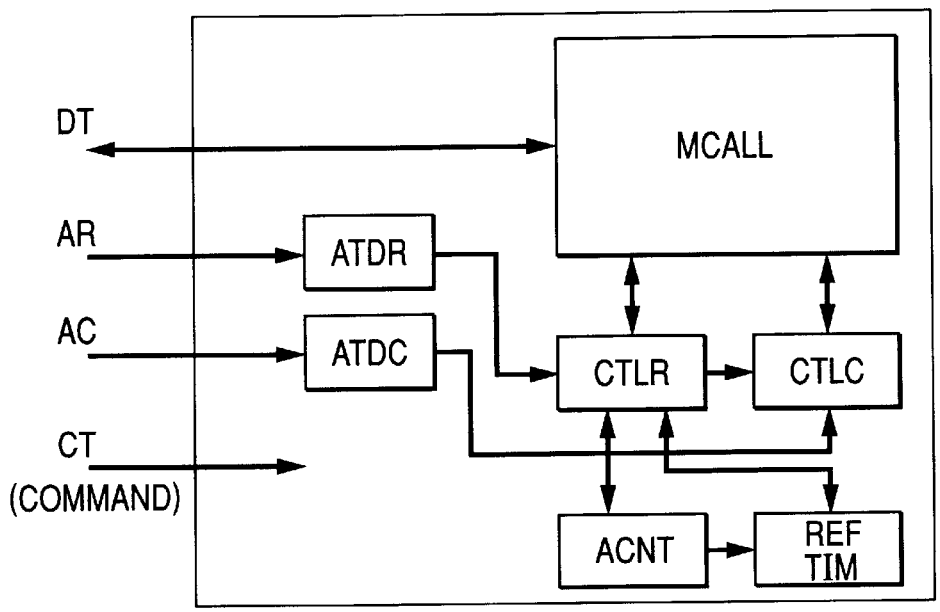
FIG. 25 is a simplified block diagram illustrating a still further embodiment of a DRAM according to the present invention.

A simplified block diagram of a still further embodiment of a DRAM according to the present invention is shown in FIG. 25. The DRAM showing the present embodiment is intended for a pseudo SRAM similar to one shown in FIG. 24. A memory circuit MACLL is provided in association with a plurality of bit lines and a plurality of word lines and includes a plurality of memory cells each of which needs a refresh operation for periodically holding memory information. Each memory cell comprises an information storage capacitor and an address selection MOSFET, for example. The gate of the address selection MOSFET is connected to its corresponding word line, one of source and drain paths is connected to its corresponding bit lines, and the other thereof is connected to its corresponding storage node of the storage capacitor.

The bit lines are provided in pairs and connected to an input/output node of a sense amplifier comprising differential latch circuits. According to the operation of selecting each word line, each memory cell is connected to one of each bit line pair, and no memory cells are connected to the other thereof. The sense amplifier uses a precharge voltage for each bit line to which no memory cells are connected, as a reference voltage, and amplifies a small potential difference between the reference voltage and a read signal read onto each bit line pair to which the memory cells are connected, to a high and a low levels, and performs rewriting or reprogramming (or refresh operation) that the state of an electrical charge in the storage capacitor that may be lost by the word line selecting operation, to the original stored state. Such a configuration can make use of the same one as the known dynamic type RAM.

In order to select the word and bit lines of the memory circuit MACLL, a row address transition detector ATDR and a column address transition detector ATDC are provided. The row address transition detector is supplied with a row address signal ADR, and the column address transition detector is supplied with a column address signal ADC, respectively. The data signal DT may include write data inputted to the memory circuit MACLL and read data outputted from the memory circuit MACLL. A signal CT may include control signals such as signals for write/read control operation, chip selection, etc.

A signal outputted from the row address transition detector ATDR is inputted to a row controller CTLR to generate a row pass timing and a column start timing. A signal outputted from the column address transition detector ATDC is inputted to a column controller CTLC to generate a column pass timing. Access to the memory circuit MACLL is executed according to the timings generated by the controllers CTLR and CTLC. Thus, when only the column address signal ADC is transitioned, column independent control is enabled and hence an input/output operation in a page mode can be effected on the corresponding word line selected by a row address selecting operation antecedent to it.

In the dynamic type memory cells referred to above, an information charge held in each storage capacitor will be lost with the elapse of time. Thus, the dynamic type memory cell needs a refresh operation for performing a read operation before such an information charge is lost and restoring it to an original charge state. A refresh timer REFTIM forms a predetermined time signal corresponding to information holding capability of the memory cell. A signal outputted from the refresh timer REFTIM is inputted to the row controller CTLR where refresh for an address specified by a refresh address counter ACNT is executed. A count up of the refresh address counter ACNT is also executed.

The row controller CTLR performs control for detecting transition of an external row address signal ADR, i.e., early one of the output signal of the row address transition detector ATDR and the output signal of the internal refresh timer REFTIM, thereby allowing either the ordinary or normal memory access or the refresh operation to be executed and allowing a non-execution operation to be carried out after its execution. Thus, even if the internal refresh operation and external access conflict with each other, no problem arises. Therefore, an external refresh request can be made unnecessary.

Figure 26:
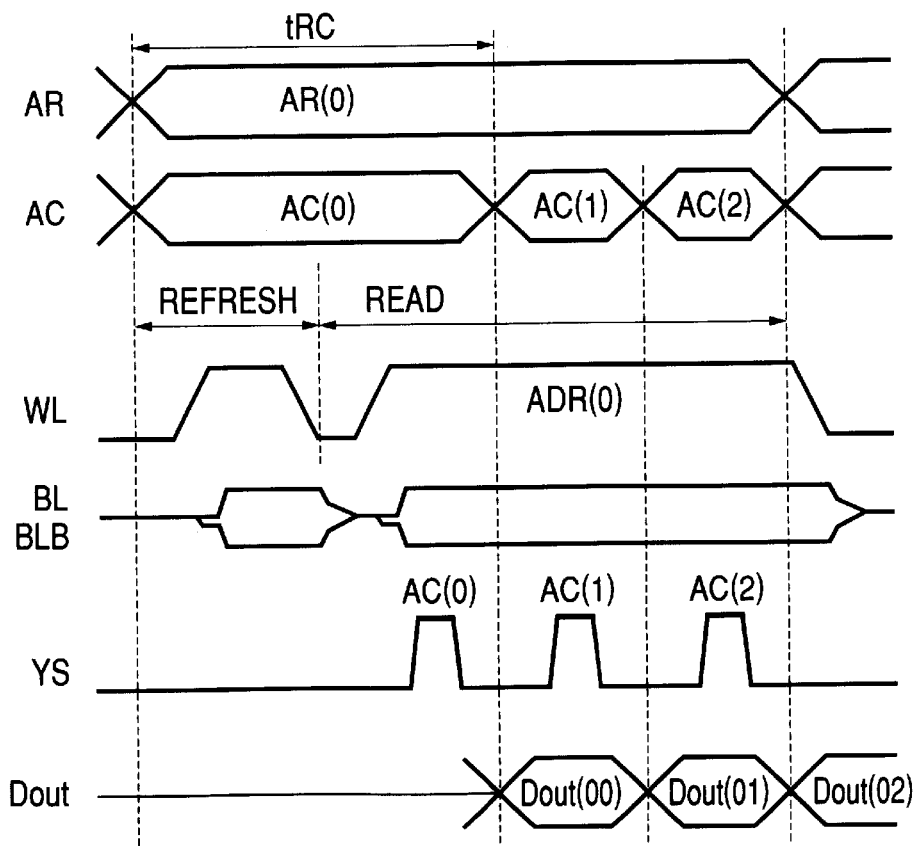
FIG. 26 is a simplified timing chart for describing one example of the operation of the embodiment shown in FIG. 25.

A simplified timing chart for describing one example of the operation of the embodiment shown in FIG. 25 is shown in FIG. 26. The same drawing shows a case in which an internal refresh request is detected earlier than the transition of an address signal AR. After the refresh operation, i.e., after a bit line pair BL and BLB is changed to a high level and a low level according to information stored in each memory cell under the selection of a word line WL by Refresh and the operation of a sense amplifier, and hence such a refresh operation as described above is executed, the word line WL is temporarily brought to a non-selected state of a low level and hence the bit line pair BL and BLB is reset (precharged). The operation (Read) of selecting a word line WL corresponding to an address signal AR (0) is performed to form a column select signal YS (AC(0)) in association with the address signal AC(0).

Such a refresh operation and a read operation start are executed within one cycle (tRC). As a result, the internal refresh operation is not recognized from outside. Thus, the external refresh request is unnecessary, and an SRAM interface swap or exchange can be realized while using the memory circuit MACLL comprising the above dynamic type memory cells.

When a read signal Dout(0) based on the column select signal YS (AC(0) corresponding to the column address signal AC(0) is outputted after one cycle (tRC), and only a column address signal (AC) changes (AC(0)→AC(1)), and a column select signal YS (AC(1)) associated with a page address is formed while a word line WL remains activated (held in a selected state), whereby data Dout(01) is read. Thereafter, when only the column address signal AC changes again (AC(1)→AC(2)), a column select signal YS (AC(2)) is formed similarly and hence Dout(02) is read.

When the row address signal AR changes (AR(0)→AR (1)) subsequently, a word line WL corresponding to the row address signal AR(0) is deactivated and a word line WL corresponding to a row address signal AR(1) is activated. Thus, since the cycle is determined according to time intervals for access to the column select signal YS and reading from the column select signal YS, a period in which only the column address signal AC changes, enables reading at a speed earlier than the one cycle tRC including the operation of selecting the word line and the amplifying operation of the sense amplifier.

When the refresh request falls behind the output signal of the address transition detector ATDR, a word line WL is deactivated after the completion of the corresponding cycle (including a page mode period), and thereafter the selection of the corresponding word line WL based on a refresh address is performed, whereby refresh is executed. Although the refresh operation falls into the next cycle in this case, no problem arises because the refresh and read operations can be carried out within one cycle tRC. Even in the case of a write operation, they are divided on a time basis in a manner similar to the read operation, and the refresh operation can be executed inside.

While a description has been made of the example in which the present invention is applied to the pseudo SRAM, the present invention is applicable even to a normal DRAM as well as to the pseudo SRAM. The application of the present invention thereto is greatly effective all the more because the pseudo SRAM rather than the normal DRAM is connected directly with the shortening of a refresh cycle time and the shortening of an access time.

Figure 27A:
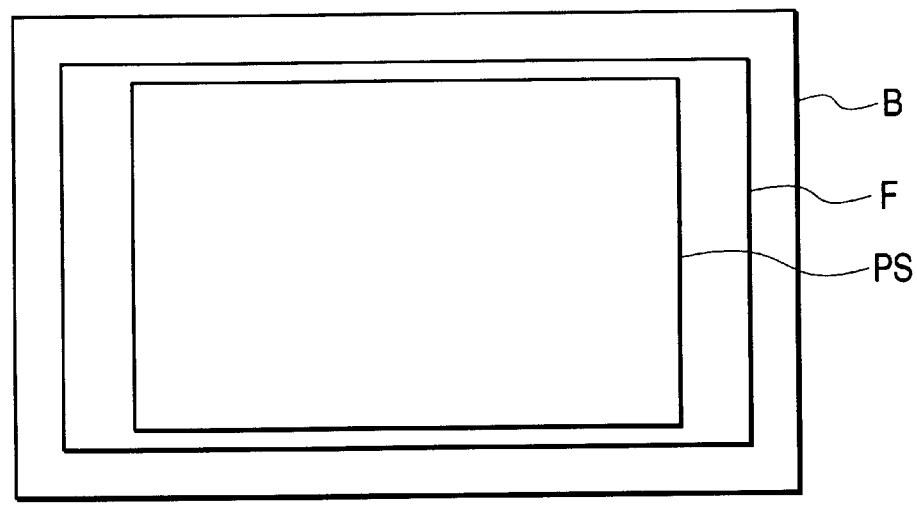
FIGS. 27(a) and 27(b) are configurational diagrams of one embodiment of a form of packaging of a pseudo SRAM according to the present invention.
Figure 27B:
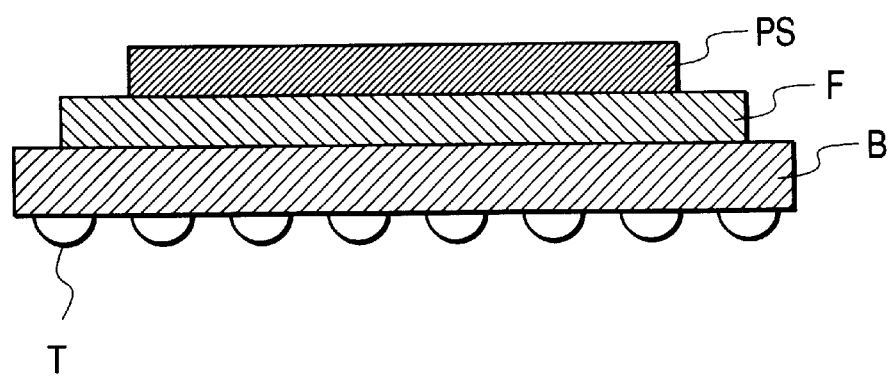

A diagram showing a configuration of one embodiment of a form of packaging of a pseudo SRAM according to the present invention is shown in FIG. 27(*a*) and FIG. 27(*b*). A flat portion is shown in the same FIG. 27(*a*) and a cross-sectional portion is shown in the same FIG. 27(*b*), respectively. A semiconductor memory according to the present embodiment is a packaged form called a stacked CSP (Chip Size Package). The semiconductor memory is characterized in that two semiconductor chips that constitute a flash memory F and a pseudo SRAM (PS) are implemented on a substrate B in a superimposed form. T indicate external terminals such as solder balls. For simplicity, the description of bonding wires is omitted.

An address signal and an input/output data signal are connected to a terminal common between the flash memory F and the pseudo SRAM (PS). On the other hand, command signals are connected to terminals different between the flash memory and the pseudo SRAM. Thus, only one of the flash memory and the pseudo SRAM can be operated. Owing to the configuration of such two memories as one semiconductor memory, data that needs data non-volatilization for power-off, and ones other that it may be used properly so as to be stored in the flash memory F and the pseudo SRAM. Alternatively, one that needs non-volatilization, of data stored in the pseudo SRAM before power-off may be transferred and held in the flash memory.

Operations and advantageous effects obtained from the above embodiments are as follows:

(1) An advantageous effect is obtained in that a semiconductor memory comprises an address input circuit for generating each of internal address signals, a redundant judgement circuit for receiving the internal address signal therein and determining whether the corresponding address corresponds to an address for a defective word line of a plurality of normal word lines, and an address counter for generating refresh address signals for sequentially refreshing the plurality of normal word lines and redundant word lines, wherein the redundant judgment circuit is deactivated upon refresh, whereby a refresh cycle time can be shortened and power consumption at refresh can be reduced.

(2) In addition to the above, an advantageous effect is obtained in that normal memory cells and redundant memory cells comprise dynamic memory cells each comprising an address selection MOSFET and an information storage capacitor, whereby mass storage capacity can be realized and a bit cost reduction can be achieved.

(3) In addition to the above, an advantageous effect is obtained in that the address counter has count outputs of the number of bits corresponding to the number of normal word lines, and generates a redundant enable signal after the formation of address signals for selecting all the normal word lines to thereby perform count operations corresponding to the number of the redundant word lines, whereby a signal for selecting each of the normal and redundant word lines can be formed with a simple configuration.

(4) In addition to the above, an advantageous effect is obtained in that a first selector for selecting the internal address signal and the refresh address signal, and a second selector for selecting the redundant enable signal and a redundant enable signal for the refresh are further provided, whereby selector simplification can be achieved.

(5) In addition to the above, an advantageous effect is obtained in that a timer for measuring a time interval required to execute a refresh operation and outputting a refresh request signal, and an arbitration circuit for arbitrating a refresh request and an access request are further provided, thereby making it possible to perform a write/read operation without sensitivity to the refresh operation, whereby the semiconductor memory can be used equivalently to a static RAM.

(6) In addition to the above, a second semiconductor chip structurally laminated on a first semiconductor chip formed with the semiconductor memory is further provided, whereby a semiconductor memory having achieved multi functioning can be obtained.

(7) In addition to the above, an advantageous effect is obtained in that a nonvolatile memory is mounted on the second semiconductor chip to thereby allow non-volatilization of necessary data.

While the invention made above by the present inventors has been described specifically by the illustrated embodiments, the invention of the present application is not limited to the embodiments. It is needless to say that various changes can be made thereto within the scope not departing from the substance thereof. For example, a memory array may be one wherein it is divided into plural form in a bit line direction and in a word line direction and a plurality of address selectors are provided in association with the divided memory cell arrays. As to word lines and bit lines, the word lines may be ones which adopt a hierarchical word line system like a main word line and local word lines. The bit lines may also be ones which adopt a hierarchical bit line system like local bit lines and a main bit line or the like.

Namely, the memory cell array and its address selectors can be configured using a device structure adopted for the known dynamic RAM and a circuit layout technology. As in this embodiment, a synchronous pseudo SRAM having refresh concealment+page mode, and refresh concealment+DRAM interface (address multi and RAS/CAS control) can also be configured.

With more functionality of electronic equipment such as a cellular phone, there has been a surge in demand for a large-capacity word RAM. While the work RAM is normally made up of an asynchronous SRAM, it is unfitted for an increase in capacity. Attention has been paid to a large-capacity DRAM as an alternative memory. However, it needs refresh and is bad in usability. A semiconductor memory according to the present invention is capable of holding compatibility with an asynchronous SRAM and is configured integrally with the flash memory, whereby various memory operations can be put to full use according to a combination with the flash memory having a non-volatile information function at power-off. The present invention can widely be used as a semiconductor memory capable of being handled equivalently to an SRAM from outside while utilizing the DRAM circuit in this way.

An advantageous effect obtained by a typical one of the inventions disclosed in the present application will be described in brief as follows: A semiconductor memory comprises an address input circuit for generating each of internal address signals, a redundant judgement circuit for receiving the internal address signal therein and determining whether the corresponding address corresponds to an address for a defective word line of a plurality of normal word lines, and an address counter for generating refresh address signals for sequentially refreshing the plurality of normal word lines and redundant word lines, wherein the redundant judgment circuit is deactivated upon refresh, whereby a refresh cycle time can be shortened and power consumption at refresh can be reduced.

What is claimed is:

1. A semiconductor memory, comprising:
    a plurality of normal word lines;
    a plurality of redundant word lines;
    a plurality of bit lines;
    normal memory cells provided at predetermined points where the plurality of normal word lines and the plurality of bits lines intersect respectively;
    a plurality of redundant memory cells provided at predetermined points where the plurality of redundant word lines and the plurality of bit lines intersect respectively;
    an address input circuit for generating each of internal address signals;
    a redundant judgement circuit for receiving the internal address signal therein and thereby determining whether a corresponding address corresponds to an address for a defective word line of the plurality of normal word lines and
    an address counter for generating refresh address signals for sequentially refreshing the plurality of normal word lines and the plurality of redundant word lines,
    wherein the redundant judgment circuit is deactivated upon refresh.

2. The semiconductor memory according to claim 1, wherein the normal memory cells and the plurality of redundant memory cells are dynamic memory cells each comprising an address selection MOSFET and an information storage capacitor.

3. The semiconductor memory according to claim 1, wherein the address counter has count outputs of the number of bits corresponding to the number of the normal word lines and generates a redundant enable signal after the formation of address signals for selecting all the plurality of normal word lines to thereby perform count operations corresponding to the number of the plurality of redundant word lines.

4. The semiconductor memory according to claim 1, further including a first selector for selecting the internal address signal and the refresh address signal, and a second selector for selecting a first redundant enable signal from the redundant judgement circuit and a second redundant enable signal from the address counter.

5. The semiconductor memory according to claim 1, further including a timer for measuring a time interval required to execute a refresh operation and outputting a refresh request signal, and an arbitration circuit for arbitrating a refresh request and an access request.

6. The semiconductor memory according to claim 5, further including a first semiconductor chip formed with the semiconductor memory and a second semiconductor chip structurally laminated on the first semiconductor chip.

7. The semiconductor memory according to claim 6, wherein the second semiconductor chip has a nonvolatile memory mounted thereon.

8. The semiconductor memory according to claim 2, wherein the address counter has count outputs of the number of bits corresponding to the number of the normal word lines and generates a redundant enable signal after the formation of address signals for selecting all the plurality of normal word lines to thereby perform count operations corresponding to the number of the plurality of redundant word lines.

9. The semiconductor memory according to claim 2, further including a first selector for selecting the internal address signal and the refresh address signal, and a second selector for selecting a first redundant enable signal from the redundant judgement circuit and a second redundant enable signal from the address counter.

10. The semiconductor memory according to claim 2, further including a timer for measuring a time interval required to execute a refresh operation and outputting a refresh request signal, and an arbitration circuit for arbitrating a refresh request and an access request.

11. A semiconductor memory, comprising:

a plurality of normal word lines;

a plurality of normal memory cells connected to the plurality of normal word lines respectively;

plurality of redundant word lines;

a plurality of redundant memory cells connected to the plurality of redundant word lines; and a refresh address signal generator, the plurality of normal memory cells and the plurality of redundant memory cells respectively needing a refresh operation, and each of cycles of said semiconductor memory being defined based on a refresh period and an access period, wherein the refresh address signal generator outputs refresh address signals for sequentially accessing the plurality of normal word lines and the plurality of redundant word lines, and wherein the plurality of normal word lines and the plurality of redundant word lines are sequentially accessed based on refresh address signals during the refresh periods of the respective cycle periods.

12. The semiconductor memory according to claim 11, wherein the plurality of normal memory cells and the plurality of redundant memory cells are dynamic memory cells, and wherein the semiconductor memory is a pseudo static random access memory.

13. The semiconductor memory according to claim 11, wherein the plurality of normal memory cells and the plurality of redundant memory cells are dynamic memory cells, and wherein the semiconductor memory is a refresh concealing memory free of a need for refresh instructions from outside the semiconductor memory.

14. The semiconductor memory according to claim 11, wherein the refresh address signal generator includes an address counter for generating the refresh address signals for sequentially refreshing the plurality of normal word lines and the plurality of redundant word lines.

15. The semiconductor memory according to claim 11, further including a judgement circuit for receiving a normal address signal therein and thereby determining whether the normal address signal indicates one of the plurality of normal word lines or the plurality of redundant word line, wherein the judgement circuit is operated during the access period.

16. The semiconductor memory according to claim 15, wherein the judgement circuit is in non-operation during the refresh period.

17. A semiconductor memory, comprising:

a plurality of normal word lines;

a plurality of normal dynamic memory cells connected to the plurality of normal word lines respectively;

a plurality of redundant word lines;

a plurality of redundant dynamic memory cells connected to the plurality of redundant word lines respectively; and a refresh address controller, the plurality of normal dynamic memory cells and the plurality of redundant dynamic memory cells respectively needing a refresh operation, and each of cycles being defined based on a refresh period and an access period, wherein the refresh address controller controls sequential access to the plurality of normal word lines and the plurality of redundant word lines, and wherein the plurality of normal word lines and the plurality of redundant word lines are sequentially accessed based on a signal outputted from the refresh address controller during the refresh periods of the respective cycle periods.

18. The semiconductor memory according to claim 17, wherein all of the normal word lines and all of the redundant word lines are accessed according to a plurality of refresh period in a plurality of access periods.

19. The semiconductor memory according to claim 17, wherein one normal word line or one redundant word line is accessed during one refresh period in one access period.

20. The semiconductor memory according to claim 17, which is a pseudo static random access memory.

21. The semiconductor memory according to claim 17, which is a refresh concealing memory free of a need for refresh instructions from outside the semiconductor memory.

* * * * *

UNITED STATES PATENT AND TRADEMARK OFFICE
CERTIFICATE OF CORRECTION

PATENT NO. : 6,851,017 B2
DATED : February 1, 2005
INVENTOR(S) : Horiguchi et al.

It is certified that error appears in the above-identified patent and that said Letters Patent is hereby corrected as shown below:

Column 18,
Line 30, insert after "lines", -- during a time of read and write operation; --
Line 35, delete "upon fresh", and insert -- during time of refreshing --

Signed and Sealed this

Twenty-second Day of March, 2005

JON W. DUDAS
*Director of the United States Patent and Trademark Office*